US008248099B2

(12) United States Patent
Otsuga et al.

(10) Patent No.: US 8,248,099 B2
(45) Date of Patent: Aug. 21, 2012

(54) SEMICONDUCTOR INTEGRATED CIRCUIT AND CIRCUIT OPERATION METHOD

(75) Inventors: Kazuo Otsuga, Kokubunji (JP); Yusuke Kanno, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 267 days.

(21) Appl. No.: 12/787,090

(22) Filed: May 25, 2010

(65) Prior Publication Data

US 2010/0301893 A1     Dec. 2, 2010

(30) Foreign Application Priority Data

May 29, 2009   (JP) .................................. 2009-130927

(51) Int. Cl.
*G01R 31/28*   (2006.01)
(52) U.S. Cl. ......... 324/763.01; 324/762.09; 324/762.01; 324/500
(58) Field of Classification Search .................. None
See application file for complete search history.

(56) References Cited

U.S. PATENT DOCUMENTS 6,504,404 B2 * 1/2003 Uchiki et al. ................... 327/65
6,794,678 B2 * 9/2004 Hasegawa et al. .............. 257/48

FOREIGN PATENT DOCUMENTS

JP          2000-133772 A      5/2000

OTHER PUBLICATIONS

Mohamed Elgebaly et al., "Variation-Aware Adaptive Voltage Scaling System", IEEE Transactions on Very Large Scale Integration (VLSI) Systems, vol. 15, No. 5, May 2007, pp. 560 to 571.

* cited by examiner

*Primary Examiner* — Melissa Koval
*Assistant Examiner* — Trung Nguyen
(74) *Attorney, Agent, or Firm* — Miles & Stockbridge P.C.

(57) ABSTRACT

In a semiconductor integrated circuit wherein low-threshold-voltage and high-threshold-voltage transistors are disposed mixedly, the operating speed of each transistor can be properly controlled in speed control execution through regulation of a power supply voltage $V_{DD}$. The semiconductor integrated circuit comprises an internal circuit and measuring circuits. The internal circuit comprises a low-threshold-voltage MOS transistor and a high-threshold-voltage MOS transistor, and the degree of threshold voltage variation of the low-threshold-voltage MOS transistor is larger than the degree of threshold voltage variation of the high-threshold-voltage MOS transistor. The measuring circuit detects which one of fast, typical, and slow states is taken by both the low-threshold-voltage MOS transistor and the high-threshold-voltage MOS transistor. When the result data detected indicates the fast state, the power supply voltage $V_{DD}$ is set to a lower power supply voltage level "$V_{DD}-\Delta V_{DD}$" corresponding to a small variation gradient "$\beta[V/\sigma]$". When the result data detected indicates the typical state, the power supply voltage $V_{DD}$ is set to an intermediate power supply voltage level "$V_{DD}\pm0$". When the result data detected indicates the slow state, the power supply voltage $V_{DD}$ is set to a higher power supply voltage level "$V_{DD}+\Delta V_{DD}$" corresponding to a large variation gradient "$\alpha[V/\sigma]$".

20 Claims, 5 Drawing Sheets

Fig.4B

| Class | $V_{DD}$ |
|---|---|
| $\overline{\underline{FF}}$ | $V_{DD} - 2\beta$ |
| $\overline{\underline{TF}}$ | $V_{DD} \pm 0$ |
| $\overline{\underline{FT}}$ | $V_{DD} \pm 0$ |
| $\overline{\underline{TT}}$ | $V_{DD} \pm 0$ |
| $(\overline{\underline{SF}})$ | $(V_{DD} + 2\beta)$ |
| $(\overline{\underline{FS}})$ | $(V_{DD} + 2\alpha)$ |
| $\overline{\underline{ST}}$ | $V_{DD} + 2\beta$ |
| $\overline{\underline{TS}}$ | $V_{DD} + 2\alpha$ |
| $\overline{\underline{SS}}$ | $V_{DD} + 2\alpha$ |

$|\alpha| > |\beta|$

Fig.5

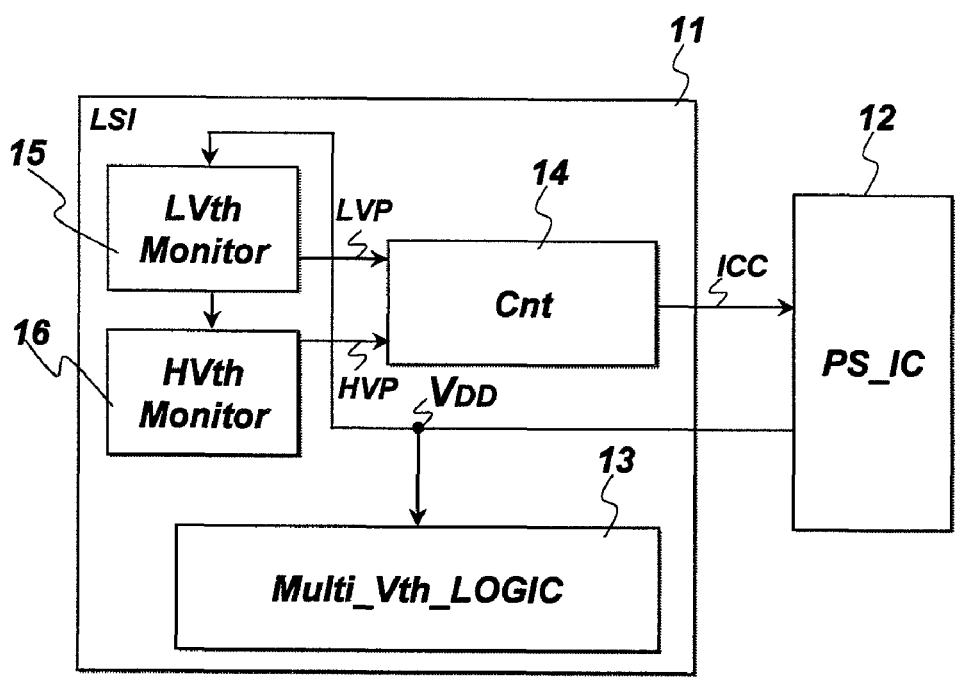

SEMICONDUCTOR INTEGRATED CIRCUIT AND CIRCUIT OPERATION METHOD

CLAIM OF PRIORITY

The present application claims priority from Japanese patent application JP 2009-130927 filed on May 29, 2009, the content of which is hereby incorporated by reference into this application.

FIELD OF THE INVENTION

The present invention relates to a semiconductor integrated circuit and a method for operation thereof, and more particularly to a technique that is effectively applicable to optimal control of the operating speed of each transistor in speed control execution through regulation of power supply voltage $V_{DD}$ in a semiconductor integrated circuit wherein low-threshold-voltage and high-threshold-voltage transistors are disposed mixedly.

BACKGROUND OF THE INVENTION

Requirements for higher integration density in semiconductor device fabrication processes tend to cause an increase in speed variation of MOS transistors (hereinafter referred to simply as transistors wherever appropriate) that are incorporated in a semiconductor integrated circuit chip. On this account, it becomes necessary to provide a surplus design margin in the phase of designing a semiconductor integrated circuit, resulting in increases in chip area and power consumption and a decrease in chip performance (operating frequency). In contrast, as a practical parameter control methodology, there is a technique for implementing speed tuning (speed variation suppression) of transistors through regulation of power supply voltage $V_{DD}$ in a semiconductor integrated circuit chip after fabrication thereof.

The technique for speed variation suppression of transistors through regulation of power supply voltage $V_{DD}$ is known as adaptive voltage scaling (AVS). The use of adaptive voltage scaling (AVS) makes it possible to implement speed variation suppression of transistors while reducing a surplus design margin, i.e., while allowing reduction in chip area and power consumption. Further, with the use of adaptive voltage scaling (AVS), it is allowed to provide enhancement in performance (operating frequency) of a semiconductor chip. The adaptive voltage scaling (AVS) is recognized as an indispensable technique in view of the current technical trend toward further possible increase in transistor speed variation since higher levels of integration are demanded in semiconductor device fabrication processes. The technique of adaptive voltage scaling (AVS) is described in detail in Non-patent Document 1 indicated below, for example.

As in the case of the adaptive voltage scaling (AVS), for controlling the operating speed of a semiconductor integrated circuit and for coping with process variations or the like, it is necessary to dynamically control power supply voltage $V_{DD}$ so that a minimum level of power supply voltage $V_{DD}$ required for achieving the chip performance (operating frequency) concerned is applied to each internal circuit of the semiconductor integrated circuit. For this purpose, a measurement is made of a signal delay in a replica circuit having a delay time equivalent to that of an internal circuit critical path in the semiconductor integrated circuit, and according to the result measured, the power supply voltage $V_{DD}$ is so controlled as to allow a signal to propagate through the replica circuit within a predetermined cycle time.

In Patent Document 1 indicated below, there is disclosed a technique for alleviating difficulty in the designing of a replica circuit through elimination of a replica circuit margin in the light of situations where just a single critical path is not necessarily provided, i.e., a plurality of critical paths having a substantially equal delay time are provided. According to the disclosure described in the Patent Document 1 indicated below, one of a plurality of transmission paths is selectively arranged as a critical path suitable for the replica circuit concerned, and the replica circuit comprises a circuit equivalent to a transmission path applicable as a critical path. More specifically, in the replica circuit, there are included a transmission path corresponding to a low-threshold-voltage transistor and a transmission path corresponding to a high-threshold-voltage transistor. In some situations, the low-threshold-voltage transistor and the high-threshold-voltage transistor may be different in the rate of process variation, and in other situations, the low-threshold-voltage transistor and the high-threshold-voltage transistor may be different in the degree of adverse effect of process variation with respect to a delay time even if there is no difference in the rate of variation. Hence, in either of the instances of process variation distributions to the worst-case side and to the best-case side, the power supply voltage $V_{DD}$ is controlled with a transmission path having a larger delay regardless of which one of the two transmission paths is arranged as a critical path.

[Patent Document 1]
Japanese Unexamined Patent Publication No. 2000-133772
[Non-patent document 1]
Mohamed Elgebaly et al., "Variation-Aware Adaptive Voltage Scaling System", IEEE TRANSACTION ON VERY LARGE SCALE INTEGRATION (VLSI) SYSTEMS, Vol. 15, No. 5, May 2007, pp. 560 to 571.

SUMMARY OF THE INVENTION

The present inventors have been engaged in research and development of semiconductor integrated circuits including low-threshold-voltage and high-threshold-voltage transistors prior to the present invention.

A circuit including transistors having high and low threshold voltages (Vth) incorporated in a semiconductor integrated circuit chip is known as a multi-Vth circuit. In the multi-Vth circuit, a low-threshold-voltage transistor is provided for a critical path in order to decrease a delay time, and a high-threshold-voltage transistor is provided for another path in order to decrease a subthreshold leak current.

In a Very Large Scale Integrated (VLSI) circuit including the multi-Vth circuit, the adaptive voltage scaling (AVS) is used to cope with fabrication process variation (P), temperature variation (T), voltage variation (V), etc. In implementation of the adaptive voltage scaling (AVS) for coping with these variations (PTV), it is required to dynamically control power supply voltage $V_{DD}$ so as to apply a minimum power supply voltage level to the multi-Vth circuit. For this purpose, a measurement is made of a signal delay in a replica circuit having a delay time equivalent to that of a critical path in the multi-Vth circuit included in the VLSI circuit, and according to the result measured, the power supply voltage $V_{DD}$ is so controlled as to allow an input signal to propagate through the replica circuit within a predetermined cycle time.

Thus, in the multi-Vth circuit included in the VLSI circuit, the replica circuit should be so arranged that accurate delay time measurement is performed on the critical path in the multi-Vth circuit. However, through pre-examinations conducted by the present inventors, it has been revealed that the replica circuit is disadvantageous in the following aspect: The replica circuit does not allow complete replication of the dependency on power supply voltage with respect to a delay time on a critical path in the multi-Vth circuit.

In the multi-Vth circuit included in the VLSI circuit, the replica circuit is provided with a low-threshold-voltage transistor and a high-threshold-voltage transistor mixedly as a matter of course. Through pre-examinations conducted by the present inventors, it has also been revealed that the degree of fabrication process variation (P) of the low-threshold-voltage transistor with respect to threshold voltage is larger than that of the high-threshold-voltage transistor.

Referring to FIG. 1, there is shown an explanatory diagram concerning differences in fabrication process variations with respect of threshold voltage levels of low-threshold-voltage transistors and high-threshold-voltage transistors that are incorporated in a CMOS Very Large Scale Integrated (CMOS VLSI) circuit formed through 45-nm linewidth semiconductor device fabrication processes investigated by the present inventors.

In FIG. 1, the horizontal axis represents the level of power supply voltage $V_{DD}$, and the vertical axis represents the level of operating frequency of transistors, i.e., operating speed thereof.

As shown in FIG. 1, the threshold voltage level of the low-threshold-voltage transistor has a relatively large degree of fabrication process variation ΔLVth, which is delineated by the thin broken line corresponding to the fast side and the thin solid line corresponding to the slow side. Contrastingly, the threshold voltage level of the high-threshold voltage transistor has a relatively small degree of fabrication process variation ΔHVth, which is delineated by the thick broken line corresponding to the fast side and the thick solid line corresponding to the slow side.

Hence, in the adaptive voltage scaling (AVS), it is required to increase the power supply voltage $V_{DD}$ by approximately 0.1 volt for speed adjustment of the high-threshold-voltage transistor in the threshold voltage level range from the slow side indicated by the thick solid line to the fast side indicated by the thick broken line. Contrastingly, for speed adjustment of the low-threshold-voltage transistor in the threshold voltage level range from the slow side indicated by the thin solid line to the fast side indicated by the thin broken line in the adaptive voltage scaling (AVS), it is required to increase the power supply voltage $V_{DD}$ by approximately 0.2 volt. For example, in order to realize an operating speed of 300 MHz in frequency, a power supply voltage $V_{DD}$ of approximately 0.95 volt should be fed to a high-threshold-voltage transistor on the fast side indicated by the thick broken line, while a power supply voltage $V_{DD}$ of approximately 1.05 volt should be fed to a high-threshold-voltage transistor on the slow side indicated by the thick solid line. Contrastingly, for providing the same operating speed of 300 MHz in frequency, a power supply voltage $V_{DD}$ of approximately 0.75 volt should be fed to a low-threshold-voltage transistor on the fast side indicated by the thin broken line, while a power supply voltage $V_{DD}$ of approximately 0.95 volt should be fed to a low-threshold-voltage transistor on the slow side indicated by the thin solid line.

Regarding possible causes of differences in fabrication process variations with respect of threshold voltage levels of low-threshold-voltage and high-threshold-voltage transistors, the following presumption can be made, though not definitely established.

As well known in the art, a current $I_D$ flowing to a drain of a MOS transistor is expressed by the following Equation (1):

$$I_D = \frac{\beta}{2}(V_{GS} - V_{TH})^2 \qquad (1)$$

where β is a channel conductance of the MOS transistor, $V_{GS}$ is a gate-source voltage thereof, and $V_{TH}$ is a gate-source threshold voltage thereof.

Further, as well known, the channel conductance β of the MOS transistor is expressed by the following Equation (2):

$$\begin{cases} \beta \propto \frac{W}{L}\mu C_{OX} \\ \mu \propto T^{\frac{3}{2}} \end{cases} \qquad (2)$$

where W is a channel width, L is a channel length, p is channel carrier mobility, $C_{OX}$ is a unit capacitance of gate oxide film, and T is an absolute temperature.

Modifying the Equation (1) with a variation factor ΔP, which includes such parameters as semiconductor process variation and power supply voltage $V_{DD}$ change, yields the following Equation (3):

$$I_D = \frac{\beta}{2}(V_{GS} - V_{TH} - \Delta P)^2 \qquad (3)$$

From the above Equation (3), the following Equation (4) is obtained.

$$\frac{\partial I_D}{\partial \Delta P} = \beta(V_{GS} - V_{TH} - \Delta P) \times (-1) \qquad (4)$$

Further, from the above Equation (3), the following equation (5) is also obtained.

$$2 \times \beta \times I_D = \beta^2(V_{GS} - V_{TH} - \Delta P)^2$$

$$\therefore -\sqrt{2\beta I_D} = -\beta(V_{GS} - V_{TH} - \Delta P) \qquad (5)$$

Hence, from the above Equations (4) and (5), the following Equation (6) is obtained.

$$\frac{\partial I_D}{\partial \Delta P} = -\sqrt{2\beta I_D} \qquad (6)$$

$$\therefore \partial I_D = -\sqrt{2\beta I_D}\, \partial \Delta P$$

From the above Equation (6), the following condition is recognized.

As can be seen from the Equations (1) and (3), in comparison between low-threshold-voltage (LVth) and high-threshold-voltage (HVth) transistors with the same gate-source voltage $V_{GS}$ applied, the drain current $I_D$ of the low-threshold-voltage (LVth) transistor (MOS transistor expressed with the Equations (1) and (3)) is relatively large due to a difference in gate-source threshold voltage $V_{TH}$.

Hence, the amount of change $\partial I_D$ in drain current $I_D$ of the MOS transistor is relatively large due to the variation factor ΔP including semiconductor process variation and power supply voltage $V_{DD}$ change, as expressed by the Equation (6). That is, in the low-threshold-voltage (LVth) transistor, since the drain current thereof is relatively large, the degree of drain current variation due to the variation factor ΔP is also relatively large. On this account, it is presumed that the threshold voltage level of the high-threshold-voltage transistor has a relatively small degree of fabrication process variation, while the threshold voltage level of the low-threshold-voltage transistor has a relatively large degree of fabrication process variation.

Therefore, in order to achieve a specified operating speed through compensation for variation in transistor threshold voltage by changing power supply voltage $V_{DD}$, it is required that a charge/discharge current corresponding to an output load capacitance be changed at a specified rate with respect to an initial drain current. Thus, for effecting a specified speed change in the low-threshold-voltage (LVth) transistor that has a large initial drain current and a large degree of variation in each of initial threshold voltage and drain current, the charge/discharge current corresponding to the output load capacitance should be changed to a certain extent. Hence, as shown in FIG. 1, it is presumed that the amount of change ΔLVth in power supply voltage $V_{DD}$ required for shifting from the slow side to the fast side in the low-threshold-voltage (LVth) transistor having a large degree of variation is larger than the amount of change ΔHVth in power supply voltage $V_{DD}$ required for shifting from the slow side to the fast side in the high-threshold-voltage (HVth) transistor having a small degree of variation.

Further, the present inventors have also carried out pre-examinations regarding another mechanism accountable for the condition that the threshold voltage level of the lower-threshold-voltage transistor has a larger degree of fabrication process variation than that of the high-threshold-voltage transistor. Described below is the mechanism pre-examined by the present inventors.

In a MOS transistor circuit such as a multi-Vth circuit, a higher speed of operation can be attained as the value of power supply voltage $V_{DD}$ becomes larger or as the value of transistor threshold voltage becomes smaller. Assuming that an output load capacitance $C_L$ of the MOS transistor circuit is subjected to driving by a drain current $I_D$ of the MOS transistor, a gate delay time $t_{pd}$ in the MOS transistor circuit is expressed by the following Equation (7):

$$t_{pd} = \frac{C_L V_{DD}}{I_D} \quad (7)$$

Further, more precisely than in the Equation (1), the drain current $I_D$ of the MOS transistor is expressed by the following Equation (8):

$$I_D = \beta(V_{DD} - V_{TH})^\alpha \quad (8)$$

where β is a channel conductance given by the Equation (2), and α is a constant dependent on a semiconductor fabrication process. It is commonly known that the typical value of α is approximately 1.5.

Hence, from the Equations (7) and (8), the following Equation (9) is given.

$$t_{pd} = \frac{C_L V_{DD}}{I_D} = \frac{C_L V_{DD}}{\beta(V_{DD} - V_{TH})^\alpha} \quad (9)$$

Thus, the Equation (9) agrees with the operating principle of adaptive voltage scaling (AVS) wherein, when there is any variation in transistor threshold voltage $V_{TH}$, the gate delay time $t_{pd}$ can be made substantially constant by adjusting the value of power supply voltage $V_{DD}$.

Further, as well known, the threshold voltage of the MOS transistor is expressed by the following Equation (10):

$$V_{TH} = 2\phi_f + V_{FB} + \frac{\sqrt{2K\varepsilon_0 q N (2\phi_f)}}{C_{OX}} \quad (10)$$

where $2\phi_f$ is the Fermi potential, $V_{FB}$ is a flat band potential, K is a relative dielectric constant of silicon, $\varepsilon_o$ is a vacuum dielectric constant, q is an electronic charge, and N is an impurity concentration in a substrate.

It is presumed here that the most significant causal factor of variation in MOS transistor threshold voltage $V_{TH}$ given by the Equation (10) is a value of variation in impurity concentration N in a substrate (or well), including variation in concentration of impurity ions implanted in channel regions.

Then, differentiating the Equation (10) with respect to the impurity concentration N yields the following Expression (11):

$$\frac{\partial V_{TH}}{\partial N} = \frac{\sqrt{2K\varepsilon_0 q(2\phi_f)}}{C_{OX}} \cdot \frac{1}{2\sqrt{N}} \quad (11)$$

Hence, from the Equation (11), it can be understood that the degree of threshold voltage variation $\partial V_{TH}/\partial N$ of the low-threshold-voltage MOS transistor having a smaller value of substrate impurity concentration N is larger than that of the high-threshold-voltage MOS transistor having a larger value of substrate impurity concentration N.

Further, the present inventors have also conducted pre-examinations regarding methodologies for controlling a delay time (operating frequency) of a multi-Vth circuit through dynamic control of power supply voltage $V_{DD}$ in adaptive voltage scaling (AVS).

Referring to FIG. 2, there is shown an explanatory diagram concerning an adaptive voltage scaling (AVS) scheme that has been pre-examined for the present invention by the present inventors. In FIG. 2, the horizontal axis indicates the degree of transistor speed variation due to semiconductor fabrication process variation, and the vertical axis indicates the level of optimal power supply voltage for providing a substantially equal speed in operation of transistors having variations in speed.

In the adaptive voltage scaling (AVS) scheme shown in FIG. 2, there are provided three split process windows, and each of the split windows is to be fed with an optimal power supply voltage. More specifically, as the three split process windows, there are provided a slow window, a typical window, and a fast window. The entire process window (including the slow, typical and fast windows) has a variation range value of 6 σ, and each of the split windows has a variation range value of 2 σ.

As shown in FIG. 2, a transistor in the slow window is fed with a relatively high level of power supply voltage "$V_{DD} - \Delta V_{DD}$", a transistor in the typical window is fed with an intermediate level of power supply voltage "$V_{DD} \pm 0$", and a transistor in the fast window is fed with a relatively low level of power supply voltage "$V_{DD} - \Delta_{DD}$". Thus, it seems that a substantially equal speed may be attainable in operation of the transistors in the three split process windows.

However, in practical application of the multi-Vth circuit, there is a difference in speed variation dependency on variation in power supply voltage $V_{DD}$ between low-thresholdvoltage and high-threshold-voltage transistors as described with reference to FIG. 1. Through pre-examinations conducted by the present inventors, the following condition has become apparent: In regard to actual implementation of adaptive voltage scaling (AVS) of FIG. 2 in the multi-Vth circuit including low-threshold-voltage and high-threshold-voltage transistors that are different in speed variation dependability on variation in power supply voltage $V_{DD}$, it is problematic that the level of power supply voltage to be fed to the multi-Vth circuit through use of the three split process windows is not defined at all.

It seems that there may be provided an arrangement wherein individual power supply voltages are fed to the low-threshold-voltage and high-threshold-voltage transistors respectively in the multi-Vth circuit. However, this arrangement is not practicable since a common power supply voltage is fed to one multi-Vth circuit in most cases of application.

The present invention has been made through the pre-examinations conducted by the present inventors in the above-mentioned technical background.

It is therefore an object of the present invention to provide a semiconductor integrated circuit having low-threshold-voltage and high-threshold-voltage transistors disposed mixedly, wherein the operating speed of each transistor can be properly controlled in speed control execution through regulation of a power supply voltage $V_{DD}$.

The above and other objects, features and advantages of the present invention will become more apparent from the descriptions contained herein with reference to the accompanying drawings.

The representative aspects of the present invention are briefed below:

In carrying out the present invention and according to one aspect thereof, there is provided a semiconductor integrated circuit comprising an internal circuit (13) and a measuring circuit (14, 15, 16). (Refer to FIG. 5.)

The internal circuit (13) comprises a low-threshold-voltage MOS transistor and a high-threshold-voltage MOS transistor, and the degree of threshold voltage variation ($\Delta$LVth) of the low-threshold-voltage MOS transistor is larger than the degree of threshold voltage variation ($\Delta$HVth) of the high-threshold-voltage MOS transistor. (Refer to FIG. 1.)

The measuring circuit (14, 15, 16) detects which one of fast, typical, and slow states is taken by both the low-threshold-voltage MOS transistor and the high-threshold-voltage MOS transistor in the internal circuit (13). (Refer to FIG. 3.)

A level of power supply voltage ($V_{DD}$) to be fed to the internal circuit (13) is set up in response to result data detected by the measuring circuit.

When the result data detected indicates the fast state, the power supply voltage ($V_{DD}$) is set to a lower power supply voltage level ($V_{DD}-\Delta V_{DD}$) corresponding to a small variation gradient ($\beta[V/\sigma]$) in terms of the rate of voltage change with respect to speed variation ($\sigma$).

When the result data detected indicates the typical state, the power supply voltage ($V_{DD}$) is set to an intermediate power supply voltage level ($V_{DD}\pm0$).

When the result data detected indicates the slow state, the power supply voltage ($V_{DD}$) is set to a higher power supply voltage level ($V_{DD}-\Delta V_{DD}$) corresponding to a large variation gradient ($\alpha[V/\sigma]$) in terms of the rate of voltage change with respect to speed variation ($\sigma$). (Refer to FIG. 3.)

To sum up, the following advantageous effect is provided according to the representative aspects of the present invention:

In accordance with the present invention, in a semiconductor integrated circuit wherein low-threshold-voltage and high-threshold-voltage transistors are disposed mixedly, it is possible to properly control the operating speed of each transistor in speed control execution through regulation of a power supply voltage $V_{DD}$.

BRIEF DESCRIPTION OF THE DRAWINGS

FIGS. 4(A) and 4(B) are explanatory diagrams showing a method for determining a power supply voltage to be used in each of three split process windows with respect to threshold voltage levels of low-threshold-voltage (LVth) and high-threshold-voltage (HVth) n-channel MOS transistors in adaptive voltage scaling (AVS) implemented in a preferred embodiment 2 of the present invention;

FIG. 5 is a block diagram showing a configuration of a semiconductor integrated circuit according to a preferred embodiment 3 of the present invention;

DETAILED DESCRIPTION OF THE PREFERRED EMBODIMENTS

1. Summary of the Preferred Embodiments

Figure 1:
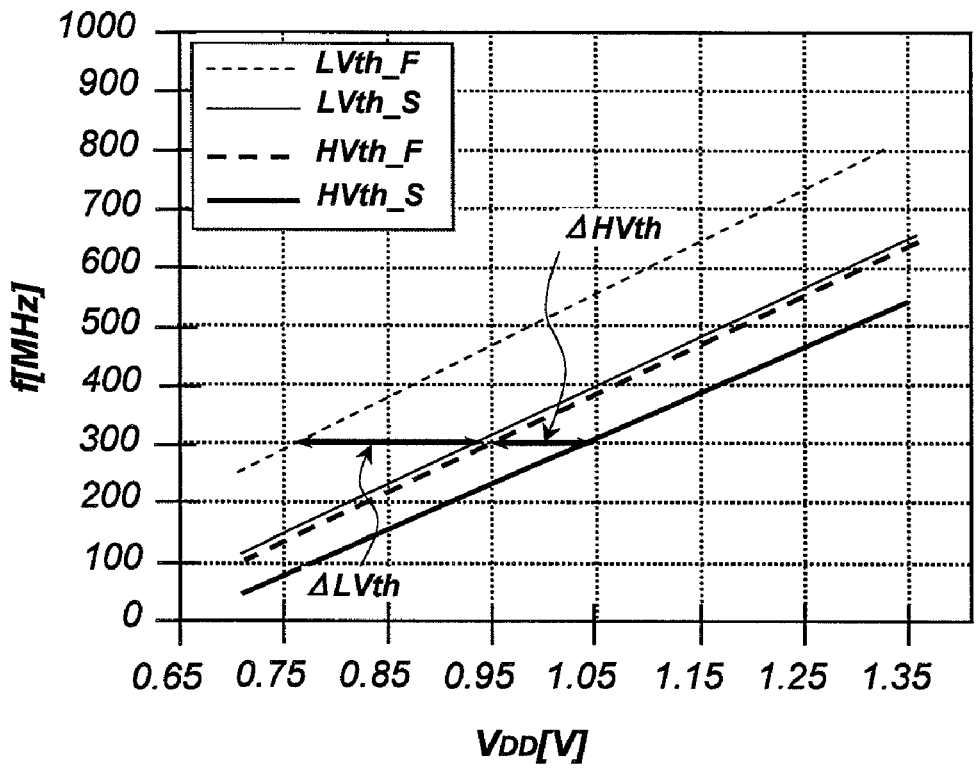
FIG. 1 is an explanatory diagram showing differences in fabrication process variations with respect to threshold voltage levels of low-threshold-voltage transistors and high-threshold-voltage transistors that are incorporated in a CMOS Very Large Scale Integrated (CMOS VLSI) circuit formed through 45-nm linewidth semiconductor device fabrication processes investigated by the present inventors.

First, the present invention will be described below regarding the overviews of representative preferred embodiments thereof. It is to be noted that, in the following description of the overviews of the representative preferred embodiments, parenthesized reference numerals are used for illustrative purposes only and designate respective parts that are included in the concepts of corresponding component elements identified by reference characters in the accompanying drawings.

[1] In accordance with a representative preferred embodiment of the present invention, there is provided a semiconductor integrated circuit comprising an internal circuit (13); and a measuring circuit (14, 15, 16); the internal circuit and the measuring circuit being formed in a semiconductor chip (11) thereof. (Refer to FIG. 5.)

The internal circuit (13) comprises a low-threshold-voltage MOS transistor and a high-threshold-voltage MOS transistor, and the degree of threshold voltage variation ($\Delta$LVth) of the low-threshold-voltage MOS transistor is larger than the degree of threshold voltage variation (ΔHVth) of the high-threshold-voltage MOS transistor. (Refer to FIG. 1.)

The measuring circuit (14, 15, 16) detects which one of fast, typical, and slow states is taken by both the low-threshold-voltage MOS transistor and the high-threshold-voltage MOS transistor in the internal circuit (13). (Refer to FIG. 3.)

A level of power supply voltage ($V_{DD}$) to be fed to the internal circuit (13) is set up in response to result data detected by the measuring circuit.

When the result data detected indicates the fast state, the power supply voltage ($V_{DD}$) is set to a lower power supply voltage level ($V_{DD}-\Delta V_{DD}$) corresponding to a small variation gradient ($\beta[V/\sigma]$) in terms of the rate of voltage change with respect to speed variation ($\sigma$).

When the result data detected indicates the typical state, the power supply voltage ($V_{DD}$) is set to an intermediate power supply voltage level ($V_{DD}\pm 0$).

When the result data detected indicates the slow state, the power supply voltage ($V_{DD}$) is set to a higher power supply voltage level ($V_{DD}+\Delta V_{DD}$) corresponding to a large variation gradient ($\alpha[V/\sigma]$) in terms of the rate of voltage change with respect to speed variation ($\sigma$). (Refer to FIG. 3.)

In the present representative embodiment mentioned above, the operating speed of each transistor can be properly controlled in speed control execution through regulation of the power supply voltage ($V_{DD}$).

More specifically, the following advantages are provided in the present representative embodiment.

In a case where the power supply voltage ($V_{DD}$) is set to the lower power supply voltage level when the result data detected indicates the fast state, it is possible to prevent an excessive decrease in the operating speed of the high-threshold-voltage MOS transistor having a smaller degree of threshold voltage variation (ΔHVth). Further, in a case where the power supply voltage ($V_{DD}$) is set to the higher power supply voltage level when the result data detected indicates the slow state, it is possible to obviate an insufficient improvement in the operating speed of the low-threshold-voltage MOS transistor having a larger degree of threshold voltage variation (ΔLVth).

According to a preferable aspect of the present representative embodiment, the measuring circuit comprises a first measuring circuit (15), and a second measuring circuit (16).

The first measuring circuit (15) serves as a process monitor circuit for detecting which one of the fast, typical, and slow states is taken by the low-threshold-voltage MOS transistor.

The second measuring circuit (16) serves as a process monitor circuit for detecting which one of the fast, typical, and slow states is taken by the high-threshold-voltage MOS transistor. (Refer to FIG. 5.)

Figure 4A:
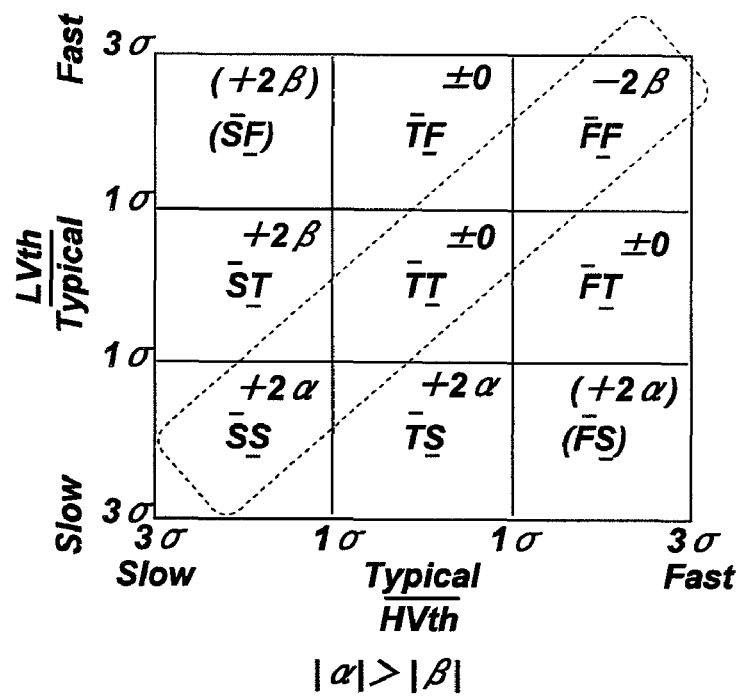

According to another preferable aspect of the present representative embodiment, when the high-threshold-voltage MOS transistor is placed in the fast state and the low-threshold-voltage MOS transistor is placed in the typical state ("FT" indicated in FIG. 4(A)), and when the high-threshold-voltage MOS transistor is placed in the typical state and the low-threshold-voltage MOS transistor is placed in the fast state ("TF" indicated in FIG. 4(A)), the power supply voltage ($V_{DD}$) is set to the intermediate power supply voltage level ($V_{DD}\pm 0$). (Refer to FIGS. 4(A) and 4(B).)

Further, according to another preferable aspect of the present representative embodiment, when the high-threshold-voltage MOS transistor is placed in the slow state and the low-threshold-voltage MOS transistor is place in the typical state ("ST" indicated in FIG. 4(A)), the power supply voltage ($V_{DD}$) is set to the higher power supply voltage level ($V_{DD}+\Delta V_{DD}$) corresponding to the small variation gradient ($\beta[V/\sigma]$) in terms of the rate of voltage change.

Still further, according to another preferable aspect of the present representative embodiment, when the high-threshold-voltage MOS transistor is placed in the typical state and the low-threshold-voltage MOS transistor is placed in the fast state ("TS" indicated in FIG. 4(A)), the power supply voltage ($V_{DD}$) is set to the higher power supply voltage level ($V_{DD}+\Delta V_{DD}$) corresponding to the large variation gradient ($\alpha[V/\sigma]$) in terms of the rate of voltage change. (Refer to FIGS. 4(A) and 4(B).)

Furthermore, according to another preferable aspect of the present representative embodiment, when the high-threshold-voltage MOS transistor is placed in the slow state and the low-threshold-voltage MOS transistor is placed in the fast state ("SF" indicated in FIG. 4(A)), the power supply voltage ($V_{DD}$) is set to the higher power supply voltage level ($V_{DD}+\Delta V_{DD}$) corresponding to the large variation gradient ($\alpha[V/\sigma]$) in terms of the rate of voltage change.

When the high-threshold-voltage MOS transistor is placed in the fast state and the low-threshold-voltage MOS transistor is placed in the slow state ("FS" indicated in FIG. 4(A)), the power supply voltage ($V_{DD}$) is set to the higher power supply voltage level ($V_{DD}+\Delta V_{DD}$) corresponding to the large variation gradient ($\alpha[V/\sigma]$) in terms of the rate of voltage change.

Moreover, according to another preferable aspect of the present representative embodiment, after the power supply voltage ($V_{DD}$) is set to one of the power supply voltage levels mentioned above, at least one of the first measuring circuit (15) and the second measuring circuit (16) is used as a replica circuit for enabling execution of speed tuning of the internal circuit (13).

According to a specific aspect of the present representative embodiment, the first measuring circuit (15) is configured to provide a first ring oscillator comprising an inverter chain having each inverter thereof arranged with the use of the low-threshold-voltage MOS transistor.

The second measuring circuit (16) is configured to provide a second ring oscillator comprising an inverter chain having each inverter thereof arranged with the use of the high-threshold-voltage MOS transistor. (Refer to FIGS. 6(A) and 6(B).)

According to another specific aspect of the present representative embodiment, the measuring circuit (14, 15, 16) further comprises a counter (142) for measuring a first oscillation frequency of the first ring oscillator provided in the first measuring circuit (15), and for measuring a second oscillation frequency of the second ring oscillator provided in the second measuring circuit (16).

Based on an output signal (CO) from the counter (142), the power supply voltage ($V_{DD}$) to be fed to the internal circuit (13) is set to one of the power supply voltage levels mentioned above. (Refer to FIG. 7.)

Further, according to another specific aspect of the present representative embodiment, based on the output signal (CO) from the counter (142), a control signal (ICC) for setting the power supply voltage ($V_{DD}$) to one of the power supply voltage levels mentioned above is produced from an output terminal of the measuring circuit (14, 15, 16). (Refer to FIGS. 7 and 8.)

Moreover, according to another specific aspect of the present representative embodiment, the semiconductor integrated circuit is arranged to be coupled to an external power supply circuit (12) disposed outside the semiconductor chip (11) thereof.

The external power supply circuit (12) is so arranged that the power supply voltage ($V_{DD}$) adjusted to one of the power supply voltage levels mentioned above is fed to the internal circuit (13) of the semiconductor integrated circuit in response to the control signal (ICC). (Refer to FIG. 5.)

[2] In accordance with another representative preferred embodiment of the present invention, there is provided a method of semiconductor integrated circuit operation, comprising a preparative step and a setup step.

In the preparative step, a semiconductor integrated circuit (11) and a power supply circuit (12) are provided preparatively.

In the setup step, a level of power supply voltage ($V_{DD}$) to be fed from the power supply circuit (12) to the semiconductor integrated circuit is set up.

Where the method of semiconductor integrated circuit operation is implemented, the semiconductor integrated circuit comprises an internal circuit (13); and a measuring circuit (14, 15, 16); the internal circuit and the measuring circuit being formed in a semiconductor chip (11) thereof. (Refer to FIG. 5.)

The internal circuit (13) comprises a low-threshold-voltage MOS transistor and a high-threshold-voltage MOS transistor, and the degree of threshold voltage variation ($\Delta$LVth) of the low-threshold-voltage MOS transistor is larger than the degree of threshold voltage variation ($\Delta$HVth) of the high-threshold-voltage MOS transistor. (Refer to FIG. 1.)

The measuring circuit (14, 15, 16) detects which one of fast, typical, and slow states is taken by both the low-threshold-voltage MOS transistor and the high-threshold-voltage MOS transistor in the internal circuit (13). (Refer to FIG. 3.)

A level of the power supply voltage ($V_{DD}$) to be fed to the internal circuit (13) is set up in response to result data detected by the measuring circuit.

When the result data detected indicates the fast state, the power supply voltage ($V_{DD}$) is set to a lower power supply voltage level ($V_{DD}-\Delta V_{DD}$) corresponding to a small variation gradient ($\beta[V/\sigma]$) in terms of the rate of voltage change with respect to speed variation ($\sigma$).

When the result data detected indicates the typical state, the power supply voltage ($V_{DD}$) is set to an intermediate power supply voltage level ($V_{DD}\pm0$).

When the result data detected indicates the slow state, the power supply voltage ($V_{DD}$) is set to a higher power supply voltage level ($V_{DD}+\Delta V_{DD}$) corresponding to a large variation gradient ($\alpha[V/\sigma]$) in terms of the rate of voltage change with respect to speed variation ($\sigma$). (Refer to FIG. 3.)

In the present representative embodiment mentioned above, the operating speed of each transistor can be properly controlled in speed control execution through regulation of the power supply voltage ($V_{DD}$).

2. Further Detailed Description of the Preferred Embodiments

The following further describes the details of preferred embodiments of the present invention. Throughout the accompanying drawings prepared for explaining the best modes for carrying out the present invention, like reference characters designate like or corresponding parts to avoid repetitive description thereof.

Preferred Embodiment 1:

<Adaptive Voltage Scaling (AVS) in Preferred Embodiment 1>

Figure 3:
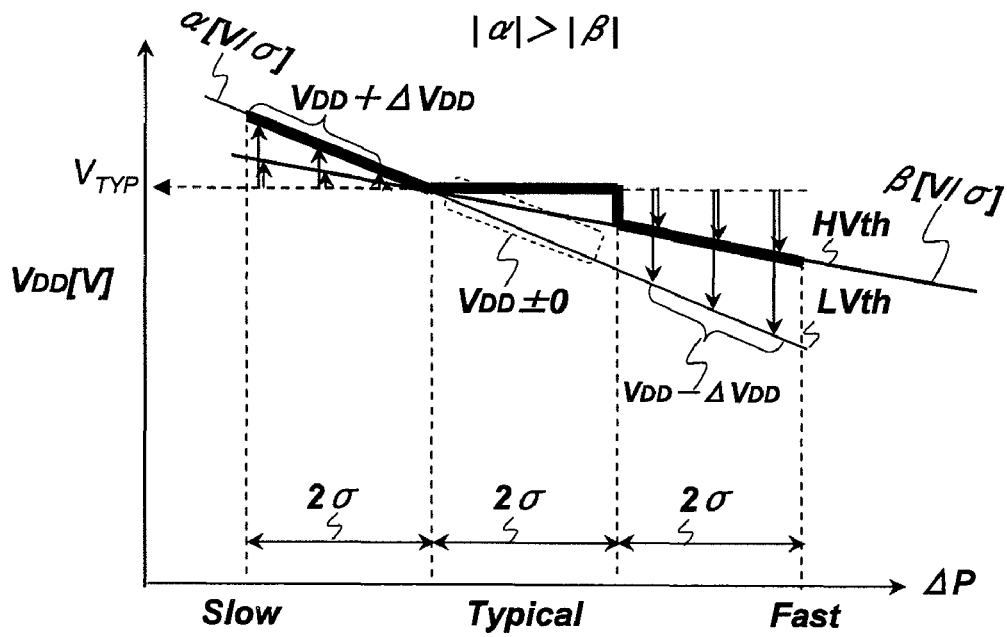
FIG. 3 is an explanatory diagram showing a method for determining a power supply voltage to be used in each of three split process windows in adaptive voltage scaling (AVS) implemented in a semiconductor integrated circuit according to a preferred embodiment 1 of the present invention.

Referring to FIG. 3, there is shown an explanatory diagram concerning a method for determining a power supply voltage to be used in each of three split process windows in adaptive voltage scaling (AVS) implemented in a semiconductor integrated circuit according to a preferred embodiment 1 of the present invention.

It is to be noted that the semiconductor integrated circuit in embodiments of the present invention comprises a multi-Vth circuit wherein low-threshold-voltage and high-threshold-voltage transistors are disposed mixedly.

<Threshold Voltage Windows>

Figure 2:
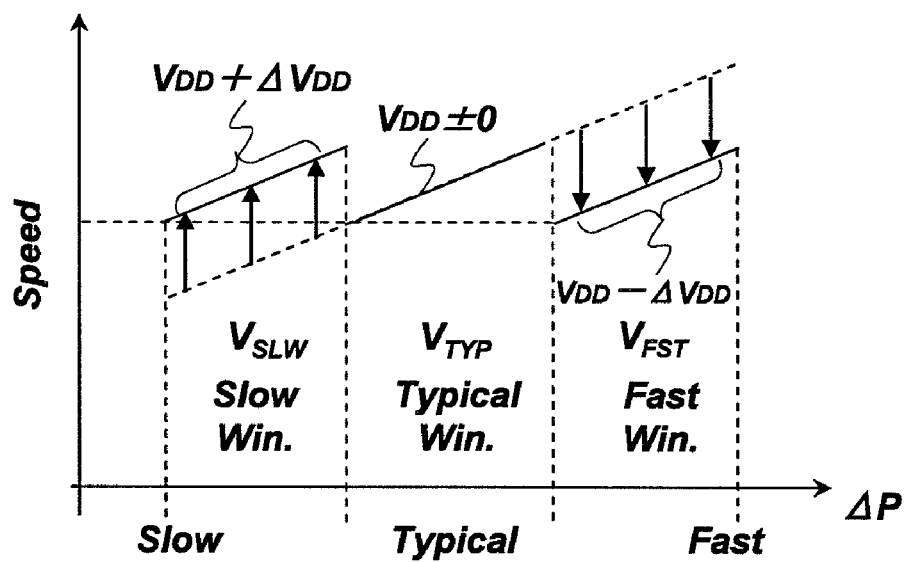
FIG. 2 is an explanatory diagram showing an adaptive voltage scaling (AVS) scheme that has been pre-examined for the present invention by the present inventors.

In FIG. 3, a low threshold voltage (LVth) of the low-threshold-voltage transistor is indicated in the form of three split process windows including a slow window, a typical window, and a fast window. Likewise, a high threshold voltage (HVth) of the high-threshold-voltage transistor is also indicated in the form of the three split process windows including the slow window, the typical window, and the fast window. As in the case of representation in FIG. 2, each of the three split process windows including the slow window, the typical window, and the fast window in FIG. 3 is provided with a variation range value of 2 $\sigma$.

<Variation Gradient of Power Supply Voltage>

Further, in FIG. 3, a relatively large value is given to a variation gradient of power supply voltage "$\alpha[V/\sigma]$" in the three split process windows including the slow window, the typical window, and the fast window for the low-threshold-voltage (LVth) transistor. Contrastingly, in FIG. 3, a relatively small value is given to a variation gradient of power supply voltage "$\beta[V/\sigma]$" in the three split process windows including the slow window, the typical window, and the fast window for the high-threshold-voltage (HVth) transistor.

The relatively large value of the variation gradient "$\alpha[V/\sigma]$" for the low-threshold-voltage (LVth) transistor shown in FIG. 3 corresponds to a relatively large degree of variation $\Delta$LVth for the low-threshold-voltage (LVth) transistor shown in FIG. 1. Likewise, the relatively small value of the variation gradient "$\beta[V/\sigma]$" for the high-threshold-voltage (HVth) transistor shown in FIG. 3 corresponds to a relatively small degree of variation $\Delta$HVth for the high-threshold-voltage (HVth) transistor shown in FIG. 1. Hence, the absolute value $|\alpha|$ of the coefficient $\alpha$ of the relatively large value of the variation gradient "$\alpha[V/\sigma]$" is larger than the absolute value $|\beta|$ of the coefficient p of the relatively small value of the variation gradient "$\beta[V/\sigma]$".

<Correlation of Threshold Voltages in Multi-Vth Transistor Circuit>

In the arrangement of low-threshold-voltage (LVth) and high-threshold-voltage (HVth) transistors formed in the same semiconductor integrated circuit chip, a strong correlation is provided between the threshold voltage level of the low-threshold-voltage (LVth) transistor and that of the high-threshold-voltage (HVth) transistor.

For example, when the threshold voltage level of the low-threshold-voltage (LVth) transistor formed in the same semiconductor chip is positioned in the slow window, there is a high degree of probability that the threshold voltage level of the high-threshold-voltage (HVth) transistor formed in the same semiconductor chip is also positioned in the slow window. Further, when the threshold voltage level of the low-threshold-voltage (LVth) transistor formed in the same semiconductor chip is positioned in the typical window, there is a high degree of probability that the threshold voltage level of the high-threshold-voltage (HVth) transistor formed in the same semiconductor chip is also positioned in the typical window. Still further, when the threshold voltage level of the low-threshold-voltage (LVth) transistor formed in the same semiconductor chip is positioned in the fast window, there is a high degree of probability that the threshold voltage level of the high-threshold-voltage (HVth) transistor formed in the same semiconductor chip is also positioned in the fast window.

The following describes in further detail the strong correlation provided between the threshold voltage levels of the low-threshold-voltage (LVth) and high-threshold-voltage (HVth) transistors formed in the same semiconductor chip.

<Methods for Multi-Vth Transistor Circuit Fabrication>

In a common example of CMOS Very Large Scale Integrated (CMOS VLSI) circuit fabrication, the threshold voltage level of an n-channel MOS transistor in a semiconductor chip is adjusted through impurity ion implantation into a channel region to be arranged immediately beneath a gate insulating film. More specifically, a p-type well region used for providing a low-threshold-voltage (LVth) n-channel MOS transistor and another p-type well region used for providing a high-threshold-voltage (HVth) n-channel MOS transistor are both formed by the same p-type well region forming process for the same semiconductor chip. Hence, at first, these p-type well regions have a substantially equal concentration of p-type impurity. Thereafter, in a state in which the p-type well region for providing the low-threshold-voltage (LVth) n-channel MOS transistor is masked with a photoresist film or the like, p-type impurity ions are implanted into the p-type well region for providing the high-threshold-voltage (HVth) n-channel MOS transistor. Consequently, in an instance where the substantially equal concentration of p-type impurity in each of the low-threshold-voltage (LVth) and high-threshold-voltage (HVth) n-channel MOS transistors is relatively high in both the p-type well regions therefor prior to the ion implantation, the threshold voltage levels of both the low-threshold-voltage (LVth) and high-threshold-voltage (HVth) n-channel MOS transistors are positioned in the slow window. Further, in an instance where the substantially equal concentration of p-type impurity in each of the low-threshold-voltage (LVth) and high-threshold-voltage (HVth) n-channel MOS transistors is proper in both the p-type well regions therefor prior to the ion implantation, the threshold voltage levels of both the low-threshold-voltage (LVth) and high-threshold-voltage (HVth) n-channel MOS transistors are positioned in the typical window. Still further, in an instance where the substantially equal concentration of p-type impurity in each of the low-threshold-voltage (LVth) and high-threshold-voltage (HVth) n-channel MOS transistors is relatively low in both the p-type well regions therefor prior to the ion implantation, the threshold voltage levels of both the low-threshold-voltage (LVth) and high-threshold-voltage (HVth) n-channel MOS transistors are positioned in the fast window.

Likewise, in another common example of CMOS Very Large Scale Integrated (CMOS VLSI) circuit fabrication, the threshold voltage level of a p-channel MOS transistor in a semiconductor chip is adjusted through impurity ion implantation into a channel region to be arranged immediately beneath a gate insulating film. More specifically, an n-type well region used for providing a low-threshold-voltage (LVth) p-channel MOS transistor and another n-type well region used for providing a high-threshold-voltage (HVth) p-channel MOS transistor are both formed by the same n-type well region forming process for the same semiconductor chip. Hence, at first, these n-type well regions have a substantially equal concentration of n-type impurity. Thereafter, in a state in which the n-type well region for providing the low-threshold-voltage (LVth) p-channel MOS transistor is masked with a photoresist film or the like, n-type impurity ions are implanted into the n-type well region for providing the high-threshold-voltage (HVth) p-channel MOS transistor. Consequently, in an instance where the substantially equal concentration of n-type impurity in each of the low-threshold-voltage (LVth) and high-threshold-voltage (HVth) p-channel MOS transistors is relatively high in both the n-type well regions therefor prior to the ion implantation, the threshold voltage levels of both the low-threshold-voltage (LVth) and high-threshold-voltage (HVth) p-channel MOS transistors are positioned in the slow window. Further, in an instance where the substantially equal concentration of n-type impurity in each of the low-threshold-voltage (LVth) and high-threshold-voltage (HVth) p-channel MOS transistors is proper in both the n-type well regions therefor prior to the ion implantation, the threshold voltage levels of both the low-threshold-voltage (LVth) and high-threshold-voltage (HVth) p-channel MOS transistors are positioned in the typical window. Still further, in an instance where the substantially equal concentration of n-type impurity in each of the low-threshold-voltage (LVth) and high-threshold-voltage (HVth) p-channel MOS transistors is relatively low in both the n-type well regions therefor prior to the ion implantation, the threshold voltage levels of both the low-threshold-voltage (LVth) and thigh-threshold-voltage (HVth) p-channel MOS transistors are positioned in the fast window.

Further, in another common example of CMOS Very Large Scale Integrated (CMOS VLSI) circuit fabrication, the threshold voltage level of an n-channel MOS transistor in a semiconductor chip is adjusted through gate insulating film thickness adjustment. More specifically, over a surface of a p-well region used for providing a low-threshold-voltage (LVth) n-channel MOS transistor and a surface of another p-type well region used for providing a high-threshold-voltage (HVth) n-channel MOS transistor, gate insulating films having a substantially equal thickness are formed simultaneously by the same insulating film forming process at first. Thereafter, an additional gate insulating film is added only to the gate insulating film of the high-threshold-voltage (HVth) n-channel MOS transistor. Consequently, in an instance where the gate insulating films formed simultaneously at first for both the low-threshold-voltage (LVth) and high-threshold-voltage (HVth) n-channel MOS transistors have a relatively large thickness, the threshold voltage levels of both the low-threshold-voltage (LVth) and high-threshold-voltage (HVth) n-channel MOS transistors are positioned in the slow window. Further, in an instance where the gate insulating films formed simultaneously at first for both the low-threshold-voltage (LVth) and high-threshold-voltage (HVth) n-channel MOS transistors have a proper thickness, the threshold voltage levels of both the low-threshold-voltage (LVth) and high-threshold-voltage (HVth) n-channel MOS transistors are positioned in the typical window. Still further, in an instance where the gate insulating films formed simultaneously at first for both the low-threshold-voltage (LVth) and high-threshold-voltage (HVth) n-channel MOS transistors have a relatively small thickness, the threshold voltage levels of both the low-threshold-voltage (LVth) and high-threshold-voltage (HVth) n-channel MOS transistors are positioned in the fast window.

Furthermore, in another common example of CMOS Very Large Scale Integrated (CMOS VLSI) circuit fabrication, the threshold voltage level of a p-channel MOS transistor in a semiconductor chip is adjusted through gate insulating film thickness adjustment. More specifically, over a surface of an n-well region used for providing a low-threshold-voltage (LVth) p-channel MOS transistor and a surface of another n-type well region used for providing a high-threshold-voltage (HVth) p-channel MOS transistor, gate insulating films having a substantially equal thickness are formed simultaneously by the same insulating film forming process at first. Thereafter, an additional gate insulating film is added only to the gate insulating film of the high-threshold-voltage (HVth) p-channel MOS transistor. Consequently, in an instance where the gate insulating films formed simultaneously at first for both the low-threshold-voltage (LVth) and high-threshold-voltage (HVth) p-channel MOS transistors have a relatively large thickness, the threshold voltage levels of both the low-threshold-voltage (LVth) and high-threshold-voltage (HVth) p-channel MOS transistors are positioned in the slow window. Further, in an instance where the gate insulating films formed simultaneously at first for both the low-threshold-voltage (LVth) and high-threshold-voltage (HVth) p-channel MOS transistors have a proper thickness, the threshold voltage levels of both the low-threshold-voltage (LVth) and high-threshold-voltage (HVth) p-channel MOS transistors are positioned in the typical window. Still further, in an instance where the gate insulating films formed simultaneously at first for both the low-threshold-voltage (LVth) and high-threshold-voltage (HVth) p-channel MOS transistors have a relatively small thickness, the threshold voltage levels of both the low-threshold-voltage (LVth) and high-threshold-voltage (HVth) p-channel MOS transistors are positioned in the fast window.

<Power Supply Voltage $V_{DD}$ Control by Adaptive Voltage Scaling (AVS)>

As described above, there is a strong correlation between the threshold voltage levels of the low-threshold-voltage (LVth) and high-threshold-voltage (HVth) transistors formed in the same semiconductor chip.

Hence, in the semiconductor integrated circuit according to the preferred embodiment 1 of the present invention, the level of power supply voltage $V_{DD}$ is controlled based on the strong correlation between the threshold voltage levels of the low-threshold-voltage (LVth) and high-threshold-voltage (HVth) transistors.

Further, the semiconductor integrated circuit according to the preferred embodiment 1 of the present invention is provided with a process monitor circuit that measures the threshold voltage levels of the low-threshold-voltage (LVth) and high-threshold-voltage (HVth) transistors formed in the same semiconductor chip as will be described below in detail.

For example, the process monitor circuit detects that the threshold voltage levels of both the low-threshold-voltage (LVth) and high-threshold-voltage (HVth) MOS transistors are positioned in the fast window. Then, in response to result data detected by the process monitor circuit, a power supply voltage controller sets up the lower power supply voltage level "$V_{DD}-\Delta V_{DD}$" for the power supply voltage $V_{DD}$ to be fed to the multi-Vth circuit wherein the low-threshold-voltage (LVth) and high-threshold-voltage (HVth) transistors are disposed mixedly.

It is to be noted, however, that the lower power supply voltage level "$V_{DD}-\Delta V_{DD}$" is determined based on the small variation gradient of power supply voltage "$\beta[V/\sigma]$" for the high-threshold-voltage (HVth) transistor shown in FIG. 3. If the lower power supply voltage level "$V_{DD}-\Delta V_{DD}$" is determined based on the large variation gradient of power supply voltage "$\alpha[V/\sigma]$" for the low-threshold-voltage (LVth) transistor shown in FIG. 3, the operating speed of the high-threshold-voltage (HVth) transistor decreases significantly in response to the lower power supply voltage level "$V_{DD}-\Delta V_{DD}$" corresponding to the large variation gradient "$\alpha[V/\sigma]$", causing a target speed not to be achieved in the high-threshold-voltage (HVth) transistor. On account of the condition mentioned above, the lower power supply voltage level "$V_{DD}-\Delta V_{DD}$" is determined based on the small variation gradient of power supply voltage "$\beta[V/\sigma]$" for the high-threshold-voltage (HVth) transistor as indicated by the solid line in FIG. 3.

Further, for example, the process monitor circuit detects that the threshold voltage levels of both the low-threshold-voltage (LVth) and high-threshold-voltage (HVth) MOS transistors are positioned in the typical window. Then, in response to result data detected by the process monitor circuit, the power supply voltage controller sets up the intermediate power supply voltage level "$V_{DD}\pm 0$" for the power supply voltage $V_{DD}$ to be fed to the multi-Vth circuit wherein the low-threshold-voltage (LVth) and high-threshold-voltage (HVth) transistors are disposed mixedly.

Still further, for example, the process monitor circuit detects that the threshold voltage levels of both the low-threshold-voltage (LVth) and high-threshold-voltage (HVth) MOS transistors are positioned in the slow window. Then, in response to result data detected by the process monitor circuit, the power supply voltage controller sets up the higher power supply voltage level "$V_{DD}+\Delta V_{DD}$" for the power supply voltage $V_{DD}$ to be fed to the multi-Vth circuit wherein the low-threshold-voltage (LVth) and high-threshold-voltage (HVth) transistors are disposed mixedly.

It is to be noted, however, that the higher power supply voltage level "$V_{DD}+\Delta V_{DD}$" is determined based on the large variation gradient of power supply voltage "$\alpha[V/\sigma]$" for the low-threshold-voltage (LVth) transistor shown in FIG. 3. If the higher supply voltage level "$V_{DD}+\Delta V_{DD}$" is determined based on the small variation gradient of power supply voltage "$\beta[V/\sigma]$" for the high-threshold-voltage (HVth) transistor shown in FIG. 3, the operating speed of the low-threshold-voltage (LVth) transistor is subjected to insufficient improvement in response to the higher power supply voltage level "$V_{DD}+\Delta V_{DD}$" corresponding to the small variation gradient "$\beta[V/\sigma]$", causing a target speed not to be achieved in the low-threshold-voltage (LVth) transistor. On account of the condition mentioned above, the higher power supply voltage level "$V_{DD}+\Delta V_{DD}$" is determined based on the large variation gradient of power supply voltage "$\alpha[V/\sigma]$" for the low-threshold-voltage (LVth) transistor as indicated by the solid line in FIG. 3.

Preferred Embodiment 2:

<Adaptive Voltage Scaling (AVS) in Preferred Embodiment 2>

Referring to FIGS. 4(A) and 4(B), there are shown explanatory diagrams concerning a method for determining a power supply voltage to be used in each of three split process windows with respect to threshold voltage levels of low-threshold-voltage (LVth) and high-threshold-voltage (HVth) n-channel MOS transistors in adaptive voltage scaling (AVS) implemented in a semiconductor integrated circuit according to a preferred embodiment 2 of the present invention.

The adaptive voltage scaling (AVS) implemented in the semiconductor integrated circuit according to the preferred embodiment 2 of the present invention, shown in FIGS. 4(A) and 4(B), is applicable even to a situation where there is just a weak correlation between the threshold voltage levels of the low-threshold-voltage (LVth) and high-threshold-voltage (HVth) transistors formed in the same semiconductor chip.

<Matrix Window Arrangement>

In FIG. 4(A), the horizontal axis indicates the three split process windows including the slow window, the typical window, and the fast window for threshold voltage level data of the high-threshold-voltage (HVth) transistor. Each of these windows is provided with a variation range value of 2 σ.

Further, in FIG. 4(A), the vertical axis indicates the three split process windows including the slow window, the typical window, and the fast window for threshold voltage level data of the low-threshold-voltage (LVth) transistor. Each of these windows is provided with a variation range value of 2 σ.

Thus, on the horizontal and vertical axes in FIG. 4(A), there is formed a matrix window having nine split areas, i.e., nine split entries corresponding to nine combinations of the threshold voltage levels of the high-threshold-voltage (HVth) and low-threshold-voltage (LVth) transistors. Each of the nine entries of the matrix window is indicated with a code consisting of two letters. In each entry, a first letter is overlined, and a second letter is underlined. The first overlined letter represents a threshold voltage state of the high-threshold-voltage (HVth) transistor, and the second underlined letter represents a state of the low-threshold-voltage (LVth) transistor. At each of the first and second positions of an entry code, the letter "F" designates a fast window state, the letter "T" designates a typical window state, and the letter "S" designates a slow window state.

That is, in the matrix window shown in FIG. 4(A), the intersection entry of the right-side entry group on the horizontal axis and the upper-side entry group on the vertical axis indicates a combination of the high-threshold-voltage (HVth) transistor in the fast window state and the low-threshold-voltage (LVth) transistor in the fast window state.

Further, the intersection entry of the center entry group on the horizontal axis and the upper-side entry group on the vertical axis indicates a combination of the high-threshold-voltage (HVth) transistor in the typical window state and the low-threshold-voltage (LVth) transistor in the fast window state.

Still further, the intersection entry of the left-side entry group on the horizontal axis and the upper-side entry group on the vertical axis indicates a combination of the high-threshold-voltage (HVth) transistor in the slow window state and the low-threshold-voltage (LVth) transistor in the fast window state.

Furthermore, the intersection entry of the right-side entry group on the horizontal axis and the center entry group on the vertical axis indicates a combination of the high-threshold-voltage (HVth) transistor in the fast window state and the low-threshold-voltage (LVth) transistor in the typical window state.

Moreover, the intersection entry of the center entry group on the horizontal axis and the center entry group on the vertical axis indicates a combination of the high-threshold-voltage (HVth) transistor in the typical window state and the low-threshold-voltage (LVth) transistor in the typical window state.

Further, the intersection entry of the left-side entry group on the horizontal axis and the center entry group on the vertical axis indicates a combination of the high-threshold-voltage (HVth) transistor in the slow window state and the low-threshold-voltage (LVth) transistor in the typical window state.

Still further, the intersection entry of the right-side entry group on the horizontal axis and the lower-side entry group on the vertical axis indicates a combination of the high-threshold-voltage (HVth) transistor in the fast window state and the low-threshold-voltage (LVth) transistor in the slow window state.

Still further, the intersection entry of the center entry group on the horizontal axis and the lower-side entry group on the vertical axis indicates a combination of the high-threshold-voltage (HVth) transistor in the typical window state and the low-threshold-voltage (LVth) transistor in the slow window state.

Furthermore, the intersection entry of the left-side entry group on the horizontal axis and the lower-side entry group on the vertical axis indicates a combination of the high-threshold-voltage (HVth) transistor in the slow window state and the low-threshold-voltage (LVth) transistor in the slow window state.

<Power Supply Voltage $V_{DD}$ Control in Matrix Window>

FIG. 4(B) shows an explanatory diagram of the levels of power supply voltage $V_{DD}$ to be provided for the respective nine split entries in the matrix window shown in FIG. 4(A).

The semiconductor integrated circuit according the preferred embodiment 2 of the present invention, similarly to the case of the semiconductor integrated circuit according to the preferred embodiment 1 of the present invention, is provided with a process monitor circuit that measures the threshold voltage levels of the low-threshold-voltage (LVth) and high-threshold-voltage (HVth) transistors formed in the same semiconductor chip as will be described below in detail.

For example, through measurement of the low threshold voltage level (LVth) and high threshold voltage level (HVth), the process monitor circuit detects which one of the nine split entries in the matrix window shown in FIG. 4(A) corresponds to the state of the semiconductor chip under measurement. Then, in response to result data detected by the process monitor circuit and in accordance with the rules indicated in the table shown in FIG. 4(B), the power supply voltage controller sets up the level of power supply voltage $V_{DD}$ to be fed to the multi-Vth circuit wherein the low-threshold-voltage (LVth) and high-threshold-voltage (HVth) transistors are disposed mixedly.

First, in the intersection entry of the right-side entry group on the horizontal axis and the upper-side entry group on the vertical axis of the matrix window shown in FIG. 4(A), the power supply voltage is set to the lower level "$V_{DD}-2\beta$". This lower level "$V_{DD}-2\beta$" corresponds to the lower power supply voltage level "$V_{DD}-\Delta V_{DD}$" based on the small variation gradient of power supply voltage "$\beta[V/\sigma]$" in the case where the threshold voltage levels of both the low-threshold-voltage (LVth) and high-threshold-voltage (HVth) MOS transistors are positioned in the fast window according to the preferred embodiment 1 of the present invention shown in FIG. 3.

Further, in the intersection entry of the center entry group on the horizontal axis and the center entry group on the vertical axis, the power supply voltage is set to the intermediate level "$V_{DD}\pm0$". This intermediate level "$V_{DD}\pm0$" corresponds to the intermediate power supply voltage level "$V_{DD}\pm0$" in the case where the threshold voltage levels of both the low-threshold-voltage (LVth) and high-threshold-voltage (HVth) MOS transistors are positioned in the typical window according to the preferred embodiment 1 of the present invention shown in FIG. 3.

Still further, in the intersection entry of the left-side entry group on the horizontal axis and the lower-side entry group on the vertical axis, the power supply voltage is set to the higher level "$V_{DD}+2\alpha$". This higher level "$V_{DD}+2\alpha$" corresponds to the higher power supply voltage level "$V_{DD}+\Delta V_{DD}$" based on the large variation gradient of power supply voltage "$\alpha[V/\sigma]$" in the case where the threshold voltage levels of both the low-threshold-voltage (LVth) and high-threshold-voltage (HVth) MOS transistors are positioned in the slow window according to the preferred embodiment 1 of the present invention shown in FIG. 3.

The three intersection entries enclosed by the broken line in FIG. 4(A) correspond respectively to the fast window, the typical window, and the slow window according to the preferred embodiment 1 of the present invention shown in FIG. 3. It is to be noted that these three intersection entries have the highest degree of probability of presence even in a situation where there is just a weak correlation between the threshold voltage levels of the low-threshold-voltage (LVth) and high-threshold-voltage (HVth) transistors formed in the same semiconductor chip.

Each of the four intersection entries described below has a lower degree of probability of presence than those of the above-mentioned three intersection entries.

First, in the intersection entry of the center entry group on the horizontal axis and the upper-side entry group on the vertical axis, the power supply voltage is set to the intermediate level "$V_{DD}\pm 0$". This intersection entry indicates that the low-threshold-voltage (LVth) transistor is placed in the fast window state while the high-threshold-voltage (HVth) transistor is placed in the typical window state. In consideration of the condition noted above, the intermediate power supply voltage level "$V_{DD}\pm 0$" is set up.

Further, in the intersection entry of the right-side entry group on the horizontal axis and the center entry group on the vertical axis, the power supply voltage is also set to the intermediate level "$V_{DD}\pm 0$". This intersection entry indicates that the high-threshold-voltage (HVth) transistor is placed in the fast window state while the lower-threshold-voltage (LVth) transistor is placed in the typical window state. In consideration of the condition noted above, the intermediate power supply voltage level "$V_{DD}\pm 0$" is set up.

Still further, in the intersection entry of the left-side entry group on the horizontal axis and the enter entry group on the vertical axis, the power supply voltage is set to the higher level "$V_{DD}+2\beta$". This intersection entry indicates that the lower-threshold-voltage (LVth) transistor is placed in the typical window state while the high-threshold-voltage (HVth) transistor is placed in the slow window state. In consideration of the condition noted above, the higher power supply voltage "$V_{DD}+2\beta$" is set up.

Furthermore, in the intersection entry of the center entry group on the horizontal axis and the lower-side entry group on the vertical axis, the power supply voltage is set to the higher level "$V_{DD}+2\alpha$". This intersection entry indicates that the high-threshold-voltage (HVth) transistor is placed in the typical window state while the lower-threshold-voltage (LVth) transistor is placed in the slow window state. In consideration of the condition noted above, the higher power supply voltage level "$V_{DD}+2\alpha$" is set up.

Each of the two intersection entries described below has a still lower degree of probability of presence than those of the above-mentioned seven intersection entries.

First, in the intersection entry of the left-side entry group on the horizontal axis and the upper-side entry group on the vertical axis, the power supply voltage is set to the higher level "$V_{DD}+2\beta$". This intersection entry indicates that the low-threshold-voltage (LVth) transistor is placed in the fast window state while the high-threshold-voltage (HVth) transistor is placed in the slow window state. In consideration of the condition noted above, the higher power supply voltage level "$V_{DD}+2\beta$" is set up.

Further, in the intersection entry of the right-side entry group on the horizontal axis and the lower-side entry group on the vertical axis, the power supply voltage is set to the higher level "$V_{DD}+2\alpha$". This intersection entry indicates that the high-threshold-voltage (HVth) transistor is placed in the fast window state while the low-threshold-voltage (LVth) transistor is placed in the slow window state. In consideration of the condition noted above, the higher power supply voltage level "$V_{DD}+2\alpha$" is set up.

The adaptive voltage scaling (AVS) implemented in the semiconductor integrated circuit according to the preferred embodiment 2 of the present invention, which is described above with reference to FIGS. 4(A) and 4(B), is fully applicable even to a situation there is just a weak correlation between the threshold voltage levels of the low-threshold-voltage (LVth) and high-threshold-voltage (HVth) transistors formed in the same semiconductor chip. Note, however, that the two intersection entries described last have an extremely low degree of probability of presence. Hence, it will be obvious to those skilled in the art that there may be provided an arrangement wherein power supply voltage control is excluded from these two intersection entries. On this account, these two intersection entries are parenthesized in FIGS. 4(A) and 4(B).

In the preferred embodiment 2 of the present invention described with reference to FIGS. 4(A) and 4(B), similarly to the case of the preferred embodiment 1 of the present invention described with reference to FIG. 3, the absolute value |α| of the coefficient a of the relatively large value of the variation gradient "α[V/σ]" is larger than the absolute value |β| of the coefficient β of the relatively small value of the variation gradient "β[V/σ]".

Preferred Embodiment 3:
<Semiconductor Integrated Circuit for Implementing Adaptive Voltage Scaling (AVS)>

As related to the preferred embodiment 1 of the present invention, it has been described that the semiconductor integrated circuit according thereto is provided with the process monitor circuit that measures the threshold voltage levels of the low-threshold-voltage (LVth) and high-threshold-voltage (HVth) transistors formed in the same semiconductor chip.

Further, as related to the preferred embodiment 2 of the present invention, it has been described that the process monitor circuit detects which one of the nine split entries in the matrix window shown in FIG. 4(A) corresponds to the state of the semiconductor chip, and that the power supply voltage controller sets up the level of power supply voltage $V_{DD}$ in accordance with the rules indicated in the table shown in FIG. 4(B).

The following will then describe a semiconductor integrated circuit according to a preferred embodiment 3 of the present invention, wherein the functionalities mentioned above are implemented in a semiconductor chip thereof.

Referring to FIG. 5, there is shown a block diagram of a configuration of the semiconductor integrated circuit according to the preferred embodiment 3 of the present invention.

As shown in FIG. 5, a semiconductor chip 11 of the semiconductor integrated circuit incorporates a multi-Vth logic circuit 13 formed as a CMOS circuit wherein low-threshold-voltage and high-threshold-voltage transistors are disposed mixedly.

<Multi-Vth Logic Circuit>

The multi-Vth logic circuit 13 comprises a low-threshold CMOS logic circuit including n-channel and p-channel MOS transistors each having a low threshold voltage characteristic as described with reference to FIG. 1, and a high-threshold CMOS logic circuit including n-channel and p-channel MOS transistors each having a high threshold voltage characteristic. In particular, it is to be noted that, in the multi-Vth logic circuit 13, the low-threshold-voltage n-channel and p-channel MOS transistors of the low-threshold CMOS logic circuit have a relatively large degree of fabrication process variation with respect to threshold voltage levels as compared with the high-threshold-voltage n-channel and p-channel MOS transistors of the high-threshold CMOS logic circuit.

The multi-Vth logic circuit 13 is representative of a central processing unit (CPU), a floating-point unit (FPU), a cryptographic processor, or a video accelerator, for example. The low-threshold CMOS logic circuit mentioned above is used to provide a critical path in such a functional block for realizing enhancement in performance thereof. Likewise, the high-threshold CMOS logic circuit mentioned above is used to provide another path in the functional block for reduction of power consumption in an active or standby state thereof.

<Process Monitor Circuit>

Further, the semiconductor chip 11 of the semiconductor integrated circuit shown in FIG. 5 incorporates process monitor circuits 15 and 16 for measuring the threshold voltage levels of the low-threshold-voltage (LVth) n-channel and p-channel MOS transistors of the low-threshold CMOS logic circuit formed in the semiconductor chip 11, and for measuring the threshold voltage levels of the high-threshold-voltage (HVth) n-channel and p-channel MOS transistors of the high-threshold CMOS logic circuit formed in the semiconductor chip 11.

The process monitor circuit 15, serving as a low-threshold-voltage process monitor circuit, measures the threshold voltage levels of the low-threshold-voltage (LVth) n-channel and p-channel MOS transistors of the low-threshold CMOS logic circuit, thereby producing low-threshold-voltage measurement result data LVP. Likewise, the process monitor circuit 16, serving as a high-threshold-voltage process monitor circuit, measures the threshold voltage levels of the high-threshold-voltage (HVth) n-channel and p-channel MOS transistors of the high-threshold CMOS logic circuit, thereby producing high-threshold-voltage measurement result data HVP.

More specifically, each of the low-threshold-voltage process monitor circuit 15 and the high-threshold-voltage process monitor circuit 16 is configured to provide a ring oscillator. Each of the low-threshold-voltage measurement result data LVP and the high-threshold-voltage measurement result data HVP is produced as an oscillation output signal from the ring oscillator.

When the threshold voltage levels of the low-threshold-voltage n-channel and p-channel MOS transistors of the low-threshold CMOS logic circuit formed in the semiconductor chip 11 are positioned in the fast window, the low-threshold-voltage process monitor circuit 15 produces the low-threshold-voltage measurement result data LVP indicated by an oscillation output signal having a higher frequency value. Further, when the threshold voltage levels of the low-threshold-voltage n-channel and p-channel MOS transistors of the low-threshold CMOS logic circuit formed in the semiconductor chip 11 are positioned in the typical window, the low-threshold-voltage process monitor circuit 15 produces the low-threshold-voltage measurement result data LVP indicated by an oscillation output signal having an intermediate frequency value. Still further, when the threshold voltage levels of the low-threshold-voltage n-channel and p-channel MOS transistors of the low-threshold CMOS logic circuit formed in the semiconductor chip 11 are positioned in the slow window, the low-threshold-voltage process monitor circuit 15 produces the low-threshold-voltage measurement result data LVP indicated by an oscillation output signal having a lower frequency value.

When the threshold voltage levels of the high-threshold-voltage n-channel and p-channel MOS transistors of the high-threshold CMOS logic circuit formed in the semiconductor chip 11 are positioned in the fast window, the high-threshold-voltage process monitor circuit 16 produces the high-threshold-voltage measurement result data HVP indicated by an oscillation output signal having a higher frequency value. Further, when the threshold voltage levels of the high-threshold-voltage n-channel and p-channel MOS transistors of the high-threshold CMOS logic circuit formed in the semiconductor chip 11 are positioned in the typical window, the high-threshold-voltage process monitor circuit 16 produces the high-threshold-voltage measurement result data HVP indicated by an oscillation output signal having an intermediate frequency value. Still further, when the threshold voltage levels of the high-threshold-voltage n-channel and p-channel MOS transistors of the high-threshold CMOS logic circuit formed in the semiconductor chip 11 are positioned in the slow window, the high-threshold-voltage process monitor circuit 16 produces the high-threshold-voltage measurement result data HVP indicated by an oscillation output signal having a lower frequency value.

<Power Supply Voltage Controller>

Furthermore, the semiconductor chip 11 of the semiconductor integrated circuit shown in FIG. 5 incorporates a power supply voltage controller 14 that is operative in response to the low-threshold-voltage measurement result data LVP from the low-threshold-voltage process monitor circuit 15 and the high-threshold-voltage measurement result data HVP from the high-threshold-voltage process monitor circuit 16.

The power supply voltage controller 14 incorporated in the semiconductor chip 11 of the semiconductor integrated circuit according to the preferred embodiment 1 of the present invention produces a control signal ICC in response to the measurement result data LVP from the process monitor circuit 15 and the measurement result data HVP from the process monitor circuit 16. The control signal ICC is provided for adjusting the level of power supply voltage $V_{DD}$ to be fed to the multi-Vth logic circuit 13 in the scheme shown in FIG. 3. In response to the control signal ICC from the power supply voltage controller 14, a power supply integrated circuit 12 coupled to the semiconductor chip 11 of the semiconductor integrated circuit feeds the power supply voltage $V_{DD}$ subjected to voltage level adjustment in the scheme shown in FIG. 3 to the low-threshold CMOS logic circuit and the high-threshold CMOS logic circuit of the multi-Vth logic circuit 13 incorporated in the semiconductor chip 11.

More specifically, when the measurement result data LVP from the process monitor circuit 15 and the measurement result data HVP from the process monitor circuit 16 indicate that the threshold voltage level of the low-threshold CMOS logic circuit formed in the semiconductor chip 11 and the threshold voltage level of the high-threshold CMOS logic circuit formed therein are positioned in the fast window, the power supply voltage $V_{DD}$ to be fed to the multi-Vth logic circuit 13 is set to the lower power supply voltage level "$V_{DD}-\Delta V_{DD}$" corresponding to the small variation gradient of power supply voltage "$\beta[V/\sigma]$".

Further, when the measurement result data LVP from the process monitor circuit 15 and the measurement result data HVP from the process monitor circuit 16 indicate that the threshold voltage level of the low-threshold CMOS logic circuit formed in the semiconductor chip 11 and the threshold voltage level of the high-threshold CMOS logic circuit formed therein are positioned in the typical window, the power supply voltage $V_{DD}$ to be fed to the multi-Vth logic circuit 13 is set to the intermediate power supply voltage level "$V_{DD}\pm 0$".

Furthermore, when the measurement result data LVP from the process monitor circuit 15 and the measurement result data HVP from the process monitor circuit 16 indicate that the threshold voltage level of the low-threshold CMOS logic circuit formed in the semiconductor chip 11 and the threshold voltage level of the high-threshold CMOS logic circuit formed therein are positioned in the slow window, the power supply voltage $V_{DD}$ to be fed to the multi-Vth logic circuit 13 is set to the higher power supply voltage level "$V_{DD}-\Delta V_{DD}$" corresponding to the large variation gradient of power supply voltage "$\alpha[V/\sigma]$".

The power supply voltage controller 14 incorporated in the semiconductor chip 11 of the semiconductor integrated circuit according to the preferred embodiment 2 of the present invention produces a control signal ICC in response to the measurement result data LVP from the process monitor circuit 15 and the measurement result data HVP from the process monitor circuit 16. The control signal ICC is provided for adjusting the level of power supply voltage $V_{DD}$ to be fed to the multi-Vth logic circuit 13 in the scheme shown in FIGS. 4(A) and 4(B). In response to the control signal ICC from the power supply voltage controller 14, the power supply integrated circuit 12 coupled to the semiconductor chip 11 of the semiconductor integrated circuit feeds the power supply voltage $V_{DD}$ subjected to voltage level adjustment in the scheme shown in FIGS. 4(A) and 4(B) to the low-threshold CMOS logic circuit and the high-threshold CMOS logic circuit of the multi-Vth logic circuit 13 incorporated in the semiconductor chip 11.

More specifically, through use of the measurement result data LVP from the process monitor circuit 15 and the measurement result data HVP from the process monitor circuit 16, it is detected which one of the nine split entries in the matrix window shown in FIG. 4(A) corresponds to the state of a combination of the threshold voltage level of the low-threshold CMOS logic circuit formed in the semiconductor chip 11 and the threshold voltage level of the high-threshold CMOS logic circuit formed therein. Then, in response to the result of this detection, the power supply voltage controller 14 produces the control signal ICC indicating which one of the nine entries in the table shown in FIG. 4(B) should be taken to set up the level of power supply voltage $V_{DD}$ to be fed to the low-threshold CMOS logic circuit and the high-threshold CMOS logic circuit of the multi-Vth logic circuit 13.

A series regulator having excellent responsivity is applicable as the power supply voltage controller 14 used for producing power supply voltage $V_{DD}$ to be fed to the multi-Vth logic circuit 13. It is recommended, however, that a switching regulator having excellent power efficiency be used as the power supply voltage controller 14.

<Configuration of Process Monitor Circuit>

Figure 6A:
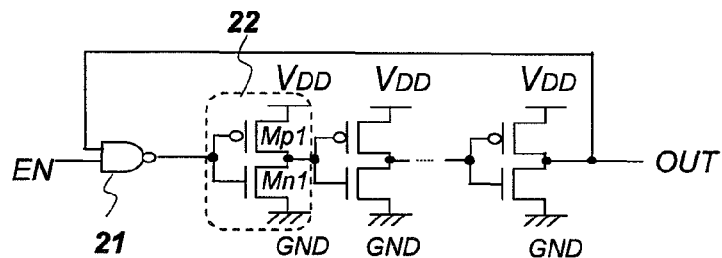
FIGS. 6(A) and 6(B) are circuit diagrams each showing a configuration of a ring oscillator that is applicable as a low-threshold-voltage process monitor circuit 15 or a high-threshold-voltage process monitor circuit 16 incorporated in a semiconductor integrated circuit chip 11 illustrated in FIG. 5.
Figure 6B:
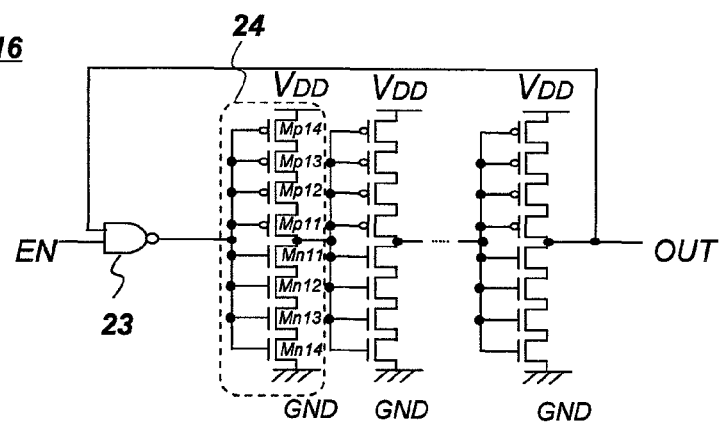

Referring to FIGS. 6(A) and 6(B), there are presented circuit diagrams each showing a configuration of a ring oscillator that is applicable as the low-threshold-voltage process monitor circuit 15 or the high-threshold-voltage process monitor circuit 16 incorporated in the semiconductor chip 11 of the semiconductor integrated circuit illustrated in FIG. 5.

FIG. 6(A) shows a configuration of a ring oscillator featuring a small chip occupancy area, though having a relatively large degree of variation in oscillation frequency due to variation in power supply voltage $V_{DD}$. As shown in FIG. 6(A), the ring oscillator includes a CMOS NAND gate 21 that receives an enable signal EN on one input terminal thereof, and an even-numbered-stage inverter chain that has an even number of inverter stages each comprising a CMOS inverter 22. When the enable signal EN to the one input terminal of the CMOS NAND gate 21 goes to a high level "1", an output signal OUT from the last-stage CMOS inverter of the even-numbered-stage inverter chain is responsively fed to an input terminal of the first-stage CMOS inverter of the even-numbered-stage inverter chain. Thus, the ring oscillator performs oscillating operations thereof. When the enable signal EN goes to a low level "0", the ring oscillator responsively stops oscillating operations thereof.

It is to be noted that the CMOS NAND gate 21 and the even-numbered-stage inverter chain having an even number of CMOS inverters 22 are configured to provide an odd-numbered-stage inverter chain in the ring oscillator. Hence, oscillating operations of the ring oscillator are performed on the principle of positive feedback through the odd-numbered-stage inverter chain. The oscillation frequency of the ring oscillator is inversely proportional to "a propagation delay time at each stage" multiplied by "a value indicating the odd number of stages". In contrast, a propagation delay time at each stage is inversely proportional to a value of power supply voltage $V_{DD}$.

In the ring oscillator shown in FIG. 6(A), each CMOS inverter 22 of the even-numbered-stage inverter chain includes a p-channel MOS transistor Mp1 having a source electrode thereof coupled to power supply voltage $V_{DD}$, and an n-channel MOS transistor Mn1 having a source electrode thereof coupled to ground potential GND.

In the formation of the ring oscillator shown in FIG. 6(A), each of the p-channel MOS transistor MP1 and the n-channel MOS transistor Mn1 included in the each CMOS inverter 22 of the even-numbered-stage inverter chain is arranged to have a low threshold voltage level through impurity ion implantation into a channel region thereof. Thus, the ring oscillator shown in FIG. 6(A) can be used as the low-threshold-voltage process monitor circuit 15 incorporated in the semiconductor chip 11 of the semiconductor integrated circuit shown in FIG. 5. Further, in the formation of the ring oscillator shown in FIG. 6(A), each of the p-channel MOS transistor Mp1 and the n-channel MOS transistor Mn1 included in the each CMOS inverter 22 of the even-numbered-stage inverter chain is arranged to have a high threshold voltage level through impurity ion implantation into a channel region thereof. Thus, the ring oscillator shown in FIG. 6(A) can be used as the high-threshold-voltage process monitor circuit 16 incorporated in the semiconductor chip 11 of the semiconductor integrated circuit shown in FIG. 5.

FIG. 6(B) shows a configuration of a ring oscillator featuring a small degree of variation in oscillation frequency due to variation in power supply voltage $V_{DD}$, though having a relatively large chip occupancy area. As shown in FIG. 6(B), the ring oscillator includes a CMOS NAND gate 23 that receives an enable signal EN on one input terminal thereof, and an even-numbered-stage inverter chain that has an even number of inverter stages each comprising a CMOS inverter 24. When the enable signal EN to the one input terminal of the CMOS NAND gate 23 goes to a high level "1", an output signal OUT from the last-stage CMOS inverter of the even-numbered-stage inverter chain is responsively fed to an input terminal of the first-stage CMOS inverter of the even-numbered-stage inverter chain. Thus, the ring oscillator performs oscillating operations thereof. When the enable signal EN goes to a low level "0", the ring oscillator responsively stops oscillating operations thereof.

In the ring oscillator shown in FIG. 6(B), each CMOS inverter 24 of the even-numbered-stage inverter chain includes four p-channel MOS transistors Mp4, Mp3, Mp2 and Mp1 coupled to power supply voltage $V_{DD}$, and four n-channel MOS transistors Mn1, Mn2, Mn3 and Mn4 coupled to ground potential GND.

In the formation of the ring oscillator shown in FIG. 6(B), each of the four p-channel MOS transistors Mp4 to Mp1 and the four n-channel MOS transistors Mn1 to Mn4 included in each CMOS inverter 24 of the even-numbered-stage inverter chain is arranged to have a low threshold voltage level through impurity ion implantation into a channel region thereof. Thus, the ring oscillator shown in FIG. 6(B) can be used as the low-threshold-voltage process monitor circuit 15 incorporated in the semiconductor chip 11 of the semiconductor integrated circuit shown in FIG. 5. Further, in the formation of the ring oscillator shown in FIG. 6(B), each of the four p-channel MOS transistors Mp4 to Mp1 and the four n-channel MOS transistors Mn1 to Mn4 included in each CMOS inverter 24 of the even-numbered-stage inverter chain is arranged to have a high threshold voltage level through impurity ion implantation into a channel region thereof. Thus, the ring oscillator shown in FIG. 6(B) can be used as the high-threshold-voltage process monitor circuit 16 incorporated in the semiconductor chip 11 of the semiconductor integrated circuit shown in FIG. 5.

<Configuration of Power Supply Voltage Controller>

Figure 7:
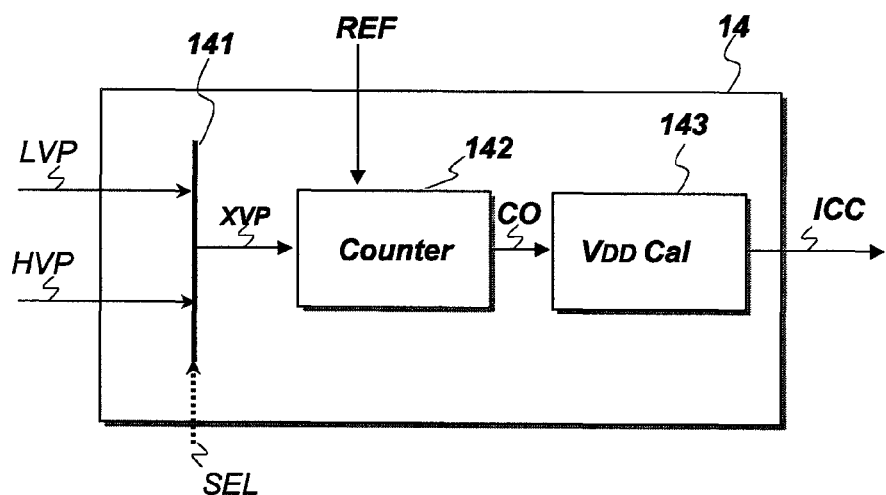
FIG. 7 is a block diagram showing a configuration of a power supply voltage controller 14 incorporated in the semiconductor integrated circuit chip 11 illustrated in FIG. 5.

Referring to FIG. 7, there is shown a block diagram of the power supply voltage controller 14 incorporated in the semiconductor chip 11 of the semiconductor integrated circuit illustrated in FIG. 5.

The power supply voltage controller 14 shown in FIG. 7 includes a selector 141, a counter 142, and a power supply voltage calculation unit 143.

First, one input terminal and the other input terminal of the selector 141 are fed with an oscillation output signal indicating the low-threshold-voltage measurement result data LVP from the low-threshold-voltage process monitor circuit 15, and an oscillation output signal indicating the high-threshold-voltage measurement result data HVP from the high-threshold-voltage process monitor circuit 16, respectively. When a selection control terminal of the selector 141 is fed with a selection signal SEL having a low level "0", the oscillation output signal indicating the low-threshold-voltage measurement result data LVP at the one input terminal of the selector 141 is taken as a selection output signal XVP. Then, the selection output signal XVP is fed to one input terminal of the counter 142. Alternatively, when the selection control terminal of the selector 141 is fed with the selection signal SEL having a high level "1", the oscillation output signal indicating the high-threshold-voltage measurement result data HVP at the other input terminal of the selector 141 is taken as a selection output signal XVP. Then, the selection output signal XVP is fed to the one input terminal of the counter 142.

The other input terminal of the counter 142 is fed with a reference clock pulse signal REF having high stability, which is produced by a quartz oscillator. For a period of time that the reference clock pulse signal REF is at a high level "1", the counter 142 measures a toggle count of the selection output signal XVP fed from the selector 141. Thus, the counter 142 produces a count output signal CO. It is to be noted that the count output signal CO produced by the counter 142 contains toggle count information regarding the oscillation output signal indicating the low-threshold-voltage measurement result data LVP, and toggle count information regarding the oscillation output signal indicating the high-threshold-voltage measurement result data HVP.

Hence, in response to the count output signal CO from the counter 142, the power supply voltage calculation unit 143 produces a control signal ICC for controlling, by the method shown in FIG. 3 or FIGS. 4(A) and 4(B), the level of power supply voltage $V_{DD}$ to be fed to the multi-Vth logic circuit 13.

<Configuration of Counter>

Figure 8:
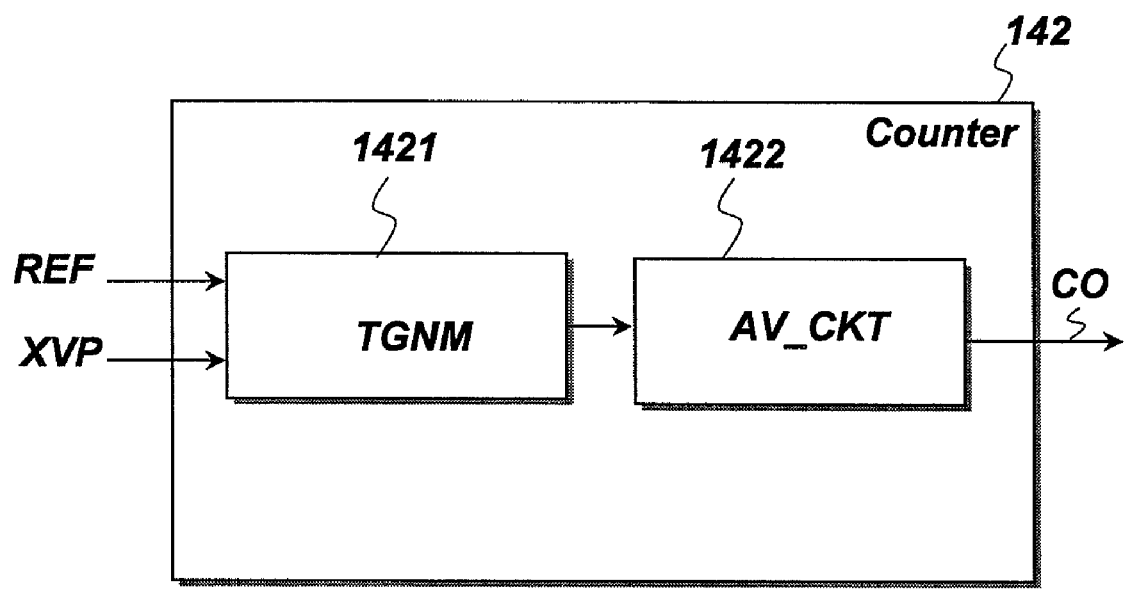
FIG. 8 is a block diagram showing a configuration of a counter 142 included in the power supply voltage controller 14 illustrated in FIG. 7.

Referring to FIG. 8, there is shown a block diagram of the counter 142 included in the power supply voltage controller 14 illustrated in FIG. 7.

The counter 142 shown in FIG. 8 includes a toggle count measuring circuit 1421 and an averaging circuit 1422.

For a period of time that the reference clock pulse signal REF is at a high level "1", the toggle count measuring circuit 1421 measures a toggle count of the selection output signal XVP fed from the selector 141. Thus, the oscillation frequency of the low-threshold-voltage measurement result data LVP and the oscillation frequency of the high-threshold-voltage measurement result data HVP are measured.

For a period corresponding to ten cycles of the reference clock pulse signal REF, the averaging circuit 1422 calculates an average value of measurement results obtained in the toggle count measuring circuit 1421, thus producing a count output signal CO with high accuracy.

<Adaptive Voltage Scaling (AVS) Operation>

In system initialization at power-on or the like for the semiconductor chip 11 of the semiconductor integrated circuit shown in FIG. 5, the control signal ICC from the power supply voltage controller 14 instructs the power supply integrated circuit 12 to take the intermediate power supply voltage level "$V_{DD} \pm 0$" for power supply voltage $V_{DD}$ to be fed to the semiconductor chip 11. While the semiconductor chip 11 is thus fed with the power supply voltage $V_{DD}$ having the intermediate power supply voltage level "$V_{DD} \pm 0$", the low-threshold-voltage process monitor circuit 15 and the high-threshold-voltage process monitor circuit 16 detect which one of the nine split entries in the matrix window shown in FIG. 4(A) corresponds to the state of the semiconductor chip 11. In response to result data detected and in accordance with the rules indicated in the table shown in FIG. 4(B), the power voltage controller 14 sets up the level of power supply voltage $V_{DD}$ to be fed to the multi-Vth logic circuit 13 wherein the low-threshold-voltage (LVth) and high-threshold-voltage (HVth) transistors are disposed mixedly.

Thus, after the level of power supply voltage $V_{DD}$ to be fed to the multi-Vth logic circuit 13 is set up in accordance with the rules indicated in the table shown in FIG. 4(B), the power supply voltage controller 14 carries out speed tuning of the multi-Vth logic circuit 13 by using the low-threshold-voltage process monitor circuit 15 and the high-threshold-voltage process monitor circuit 16 as replica circuits.

More specifically, in the case of system initialization where the lower power supply voltage level "$V_{DD} - \Delta V_{DD}$" corresponding to the small variation gradient of power supply voltage "$\beta[V/\sigma]$" is selected in accordance with the rules indicated in the table shown in FIG. 4(B), the high-threshold-voltage process monitor circuit 16 is used as a replica circuit.

In this state, the power supply voltage controller 14 performs fine adjustment of the lower power supply voltage level "$V_{DD} - \Delta V_{DD}$" so that the count output signal CO from the counter 142 indicates a frequency count value corresponding to the target operating speed concerned.

Further, in the case of system initialization where the higher power supply voltage level "$V_{DD} + \Delta V_{DD}$" corresponding to the small variation gradient of power supply voltage "$\beta[V/\sigma]$" is selected in accordance with the rules indicated in the table shown in FIG. 4(B), the high-threshold-voltage process monitor circuit 16 is also used as a replica circuit. In this state, the power supply voltage controller 14 performs fine adjustment of the higher power supply voltage level "$V_{DD} + \Delta V_{DD}$" so that the count output signal CO from the counter 142 indicates a frequency count value corresponding to the target operating speed concerned.

Still further, in the case of system initialization where the significantly higher power supply voltage level "$V_{DD} + \Delta V_{DD}$" corresponding to the large variation gradient of power supply voltage "$\alpha[V/\sigma]$" is selected in accordance with the rules indicated in the table shown in FIG. 4(B), the low-threshold-voltage process monitor circuit 15 is used as a replica circuit. In this state, the power supply voltage controller 14 performs fine adjustment of the significantly higher power supply voltage level "$V_{DD} + \Delta V_{DD}$" so that the count output signal CO from the counter 142 indicates a frequency count value corresponding to the target operating speed concerned.

Besides the operation mentioned above, in system initialization, while the semiconductor chip 11 is fed with the power supply voltage $V_{DD}$ having the intermediate power supply voltage level "$V_{DD}\pm0$" at first, the low-threshold-voltage process monitor circuit 15 and the high-threshold-voltage process monitor circuit 16 detect which one of the three split process windows shown in FIG. 3 corresponds to the state of the semiconductor chip 11. In response to the result of this detection, the power supply voltage controller 14 sets up the level of power supply voltage $V_{DD}$ to be fed to the multi-Vth logic circuit 13 wherein the low-threshold-voltage (LVth) and high-threshold-voltage (HVth) transistors are disposed mixedly. In this power supply voltage level setting, one of the following levels, shown in FIG. 3, is selected: the lower power supply voltage level "$V_{DD}-\Delta V_{DD}$" corresponding to the small variation gradient of power supply voltage "$\beta[V/\sigma]$"; the intermediate power supply voltage level "$V_{DD}\pm0$"; and the higher power supply voltage level "$V_{DD}+\Delta V_{DD}$" corresponding to the large variation gradient of power supply voltage "$\alpha[V/\sigma]$". Thereafter, using the low-threshold-voltage process monitor circuit 15 and the high-threshold-voltage process monitor circuit 16 as replica circuits, the power supply voltage controller 14 carries out speed tuning of the multi-Vth logic circuit.

More specifically, in the case of system initialization where the lower power supply voltage level "$V_{DD}-\Delta V_{DD}$" corresponding to the small variation gradient of power supply voltage "$\beta[V/\sigma]$" is selected, the high-threshold-voltage process monitor circuit 16 is used as a replica circuit. In this state, the power supply voltage controller 14 performs fine adjustment of the lower power supply voltage level "$V_{DD}-\Delta V_{DD}$".

Further, in the case of system initialization where the higher power supply voltage level "$V_{DD}+\Delta V_{DD}$" corresponding to the large variation gradient of power supply voltage "$\alpha[V/\sigma]$" is selected, the high-threshold-voltage process monitor circuit 16 is used as a replica circuit. In this state, the power supply voltage controller 14 performs fine adjustment of the higher power supply voltage level "$V_{DD}+\Delta V_{DD}$".

While the present invention made by the present inventors has been described in detail with respect to specific embodiments thereof, it is to be understood that the present invention is not limited by any of the details of description and that various changes and modifications may be made in the present invention without departing from the spirit and scope thereof.

For example, there may also be provided such a modified arrangement that five split process windows are used in lieu of the three split process windows according to the preferred embodiment 1 of the present invention shown in FIG. 3. That is, the fast window is further split into a fast-slow window and a fast-fast window, and the slow window is further split into a slow-slow window and a slow-fast window. In this modified arrangement, the fast-fast window indicates a power supply voltage level "$V_{DD}-\Delta V_{DD}$" that is still lower than that indicated by the fast-slow window, and the slow-slow window indicates a power supply voltage "$V_{DD}+\Delta V_{DD}$" that is still higher than that indicated by the slot-fast window.

Further, there may also be provided such a modified arrangement that 25 split entries are used in the matrix window in lieu of the nine split entries according to the preferred embodiment 2 of the present invention shown in FIG. 4(A). That is, the threshold voltage level of the high-threshold-voltage (HVth) transistor on the horizontal axis is split into five entry groups, and the threshold voltage level of the low-threshold-voltage (LVth) transistor is split into five entry groups, thereby providing a total of 25 entries in the matrix window.

Still further, the semiconductor chip 11 of the semiconductor integrated circuit shown in FIG. 5 may incorporate a high-voltage MOS circuit fed with an external power supply voltage Ext_$V_{DD}$, an external interface circuit, an analog function block (A/D converter, D/A converter), and the like.

Furthermore, the semiconductor chip 11 of the semiconductor integrated circuit shown in FIG. 5 may incorporate an internal power supply circuit having functions substantially equivalent to those of the power supply integrated circuit 12. In an arrangement wherein the internal power supply circuit incorporated in the semiconductor chip 11 is fed with an external power supply voltage Ext_$V_{DD}$, the internal power supply circuit incorporated in the semiconductor chip 11 produces each power supply voltage $V_{DD}$ to be fed to each of the multi-Vth logic circuit 13, the low-threshold-voltage process monitor circuit 15, and the high-threshold-voltage process monitor circuit 16.

What is claimed is:

1. A semiconductor integrated circuit, comprising:
an internal circuit; and
a measuring circuit,
wherein the internal circuit and the measuring circuit are formed in a semiconductor chip,
wherein the internal circuit comprises a low-threshold-voltage MOS transistor and a high-threshold-voltage MOS transistor, and the degree of threshold voltage variation of the low-threshold-voltage MOS transistor is larger than the degree of threshold voltage variation of the high-threshold-voltage MOS transistor,
wherein the measuring circuit detects which one of fast, typical, and slow states is taken by both the low-threshold-voltage MOS transistor and the high-threshold-voltage MOS transistor in the internal circuit,
wherein a level of power supply voltage to be fed to the internal circuit is set up in response to result data detected by the measuring circuit,
wherein, when the result data detected indicates the fast state, the power supply voltage is set to a lower power supply voltage level corresponding to a small variation gradient in terms of the rate of voltage change with respect to speed variation,
wherein, when the result data detected indicates the typical state, the power supply voltage is set to an intermediate power supply voltage level, and
wherein, when the result data detected indicates the slow state, the power supply voltage is set to a higher power supply voltage level corresponding to a large variation gradient in terms of the rate of voltage change with respect to speed variation.

2. The semiconductor integrated circuit according to claim 1,
wherein the measuring circuit comprises a first measuring circuit, and a second measuring circuit,
wherein the first measuring circuit detects which one of the fast, typical, and slow states is taken by the low-threshold-voltage MOS transistor, and
wherein the second measuring circuit detects which one of the fast, typical, and slow states is taken by the high-threshold-voltage MOS transistor.

3. The semiconductor integrated circuit according to claim 2,
wherein, when the high-threshold-voltage MOS transistor is placed in the fast state and the low-threshold-voltage MOS transistor is placed in the typical state, and when the high-threshold-voltage MOS transistor is placed in the typical state and the low-threshold-voltage MOS transistor is placed in the fast state, the power supply voltage is set to the intermediate power supply voltage level.

4. The semiconductor integrated circuit according to claim 3,
wherein, when the high-threshold-voltage MOS transistor is placed in the slow state and the low-threshold-voltage MOS transistor is place in the typical state, the power supply voltage is set to the higher power supply voltage level corresponding to the small variation gradient in terms of the rate of voltage change.

5. The semiconductor integrated circuit according to claim 4,
wherein, when the high-threshold-voltage MOS transistor is placed in the typical state and the low-threshold-voltage MOS transistor is placed in the fast state, the power supply voltage is set to the higher power supply voltage level corresponding to the large variation gradient in terms of the rate of voltage change.

6. The semiconductor integrated circuit according to claim 5,
wherein, when the high-threshold-voltage MOS transistor is placed in the slow state and the low-threshold-voltage MOS transistor is placed in the fast state, the power supply voltage is set to the higher power supply voltage level corresponding to the large variation gradient in terms of the rate of voltage change, and
wherein, when the high-threshold-voltage MOS transistor is placed in the fast state and the low-threshold-voltage MOS transistor is placed in the slow state, the power supply voltage is set to the higher power supply voltage level corresponding to the large variation gradient in terms of the rate of voltage change.

7. The semiconductor integrated circuit according to any one of claim 1,
wherein, after the power supply voltage is set to one of the power supply voltage levels, at least one of the first measuring circuit and the second measuring circuit is used as a replica circuit for enabling execution of speed tuning of the internal circuit.

8. The semiconductor integrated circuit according to any one of claim 1,
wherein the first measuring circuit is comprised of a first ring oscillator comprising an inverter chain comprising each inverter thereof arranged with the use of the low-threshold-voltage MOS transistor, and
wherein the second measuring circuit is comprised of provide a second ring oscillator comprising an inverter chain comprising each inverter thereof arranged with the use of the high-threshold-voltage MOS transistor.

9. The semiconductor integrated circuit according to claim 8,
wherein the measuring circuit further comprises a counter for measuring a first oscillation frequency of the first ring oscillator configuring the first measuring circuit, and for measuring a second oscillation frequency of the second ring oscillator configuring the second measuring circuit, and
wherein, based on an output signal from the counter, the power supply voltage to be fed to the internal circuit is set to one of the power supply voltage levels.

10. The semiconductor integrated circuit according to claim 9,
wherein, based on the output signal from the counter, a control signal for setting the power supply voltage to one of the power supply voltage levels is produced from an output terminal of the measuring circuit.

11. The semiconductor integrated circuit according to claim 10,
wherein the semiconductor integrated circuit is arranged to be coupled to an external power supply circuit disposed outside the semiconductor chip thereof, and
wherein the external power supply circuit is so arranged that the power supply voltage adjusted to one of the power supply voltage levels is fed to the internal circuit of the semiconductor integrated circuit in response to the control signal.

12. A method of semiconductor integrated circuit operation, comprising the steps of:
providing a semiconductor integrated circuit and a power supply circuit preparatively; and
setting up a level of power supply voltage to be fed from the power supply circuit to the semiconductor integrated circuit;
wherein the semiconductor integrated circuit comprises an internal circuit; and a measuring circuit, the internal circuit and the measuring circuit being formed in a semiconductor chip thereof,
wherein the internal circuit comprises a low-threshold-voltage MOS transistor and a high-threshold-voltage MOS transistor, and the degree of threshold voltage variation of the low-threshold-voltage MOS transistor is larger than the degree of threshold voltage variation of the high-threshold-voltage MOS transistor,
wherein the measuring circuit detects which one of fast, typical, and slow states is taken by both the low-threshold-voltage MOS transistor and the high-threshold-voltage MOS transistor in the internal circuit,
wherein a level of the power supply voltage to be fed to the internal circuit is set up in response to result data detected by the measuring circuit,
wherein, when the result data detected indicates the fast state, the power supply voltage is set to a lower power supply voltage level corresponding to a small variation gradient in terms of the rate of voltage change with respect to speed variation,
wherein, when the result data detected indicates the typical state, the power supply voltage is set to an intermediate power supply voltage level, and
wherein, when the result data detected indicates the slow state, the power supply voltage is set to a higher power supply voltage level corresponding to a large variation gradient in terms of the rate of voltage change with respect to speed variation.

13. The method of semiconductor integrated circuit operation according to claim 12,
wherein the measuring circuit comprises a first measuring circuit, and a second measuring circuit,
wherein the first measuring circuit detects which one of the fast, typical, and slow states is taken by the low-threshold-voltage MOS transistor, and
wherein the second measuring circuit detects which one of the fast, typical, and slow states is taken by the high-threshold-voltage MOS transistor.

14. The method of semiconductor integrated circuit operation according to claim 13,
wherein, when the high-threshold-voltage MOS transistor is placed in the fast state and the low-threshold-voltage MOS transistor is placed in the typical state, and when the high-threshold-voltage MOS transistor is placed in the typical state and the low-threshold-voltage MOS transistor is placed in the fast state, the power supply voltage is set to the intermediate power supply voltage level.

15. The method of semiconductor integrated circuit operation according to claim 14,
wherein, when the high-threshold-voltage MOS transistor is placed in the slow state and the low-threshold-voltage MOS transistor is place in the typical state, the power supply voltage is set to the higher power supply voltage level corresponding to the small variation gradient in terms of the rate of voltage change.

16. The method of semiconductor integrated circuit operation according to claim 15,
wherein, when the high-threshold-voltage MOS transistor is placed in the typical state and the low-threshold-voltage MOS transistor is placed in the fast state, the power supply voltage is set to the higher power supply voltage level corresponding to the large variation gradient in terms of the rate of voltage change.

17. The method of semiconductor integrated circuit operation according to claim 16,
wherein, when the high-threshold-voltage MOS transistor is placed in the slow state and the low-threshold-voltage MOS transistor is placed in the fast state, the power supply voltage is set to the higher power supply voltage level corresponding to the large variation gradient in terms of the rate of voltage change, and
wherein, when the high-threshold-voltage MOS transistor is placed in the fast state and the low-threshold-voltage MOS transistor is placed in the slow state, the power supply voltage is set to the higher power supply voltage level corresponding to the large variation gradient in terms of the rate of voltage change.

18. The method of semiconductor integrated circuit operation according to claim 12,
wherein, after the power supply voltage is set to one of the power supply voltage levels, at least one of the first measuring circuit and the second measuring circuit is used as a replica circuit for enabling execution of speed tuning of the internal circuit.

19. The method of semiconductor integrated circuit operation according to claim 12,
wherein the first measuring circuit is comprised of a first ring oscillator comprising an inverter chain comprising each inverter thereof arranged with the use of the low-threshold-voltage MOS transistor, and
wherein the second measuring circuit is comprised of a second ring oscillator comprising an inverter chain comprising each inverter thereof arranged with the use of the high-threshold-voltage MOS transistor.

20. The method of semiconductor integrated circuit operation according to claim 19,
wherein the measuring circuit further comprises a counter for measuring a first oscillation frequency of the first ring oscillator configuring the first measuring circuit, and for measuring a second oscillation frequency of the second ring oscillator configuring the second measuring circuit, and
wherein, based on the output signal from the counter, a control signal for setting the power supply voltage to one of the power supply voltage levels is produced from an output terminal of the measuring circuit.

* * * * *